(12) United States Patent
Tanizaki et al.

(10) Patent No.: US 8,323,402 B2
(45) Date of Patent: Dec. 4, 2012

(54) METHOD FOR GROWING ALUMINUM NITRIDE CRYSTAL, PROCESS FOR PRODUCING ALUMINUM NITRIDE CRYSTAL, AND ALUMINUM NITRIDE CRYSTAL

(75) Inventors: Keisuke Tanizaki, Itami (JP); Naho Mizuhara, Itami (JP); Michimasa Miyanaga, Osaka (JP); Hideaki Nakahata, Itami (JP); Yoshiyuki Yamamoto, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 526 days.

(21) Appl. No.: 12/595,957

(22) PCT Filed: Dec. 19, 2008

(86) PCT No.: PCT/JP2008/073161
§ 371 (c)(1),
(2), (4) Date: Oct. 15, 2009

(87) PCT Pub. No.: WO2009/090831
PCT Pub. Date: Jul. 23, 2009

(65) Prior Publication Data
US 2010/0143748 A1  Jun. 10, 2010

(30) Foreign Application Priority Data

Jan. 15, 2008 (JP) ................................ 2008-005544
Nov. 4, 2008 (JP) ................................ 2008-283425

(51) Int. Cl.
*C30B 1/10* (2006.01)

(52) U.S. Cl. ............. 117/7; 117/2; 117/3; 117/6; 117/9; 117/84; 117/88; 117/94; 117/95; 117/97; 117/106; 438/758; 438/759; 438/761; 438/763

(58) Field of Classification Search ................. 117/2–3, 117/6–7, 9, 84, 88, 94–95, 97, 106, 952; 438/758–759, 761, 763
See application file for complete search history.

(56) References Cited

U.S. PATENT DOCUMENTS 4,517,118 A * 5/1985 Stoetzer ........................ 252/513
(Continued)

FOREIGN PATENT DOCUMENTS

JP H09-268096 A 10/1997
(Continued)

OTHER PUBLICATIONS

CRC Handbook of Chemistry and Physics, 92nd Edition (Dec. 2011), p. 4-96.*
Product Data Sheet for Aquadag E published by Acheson Colloids Company (2007), available from http://www.semicro.org/Aquadag%20E%20TDS.pdf.*
Materials Data Sheets for pyrolytic boron nitride (PBN) and graphite, available from http://www.matweb.com, accessed on Mar. 28, 2012.*

(Continued)

*Primary Examiner* — Michael Kornakov
*Assistant Examiner* — Kenneth A Bratland, Jr.
(74) *Attorney, Agent, or Firm* — James W. Judge

(57) ABSTRACT

Methods of growing and manufacturing aluminum nitride crystal, and aluminum nitride crystal produced by the methods. Preventing sublimation of the starting substrate allows aluminum nitride crystal of excellent crystallinity to be grown at improved growth rates. The aluminum nitride crystal growth method includes the following steps. Initially, a laminar baseplate is prepared, furnished with a starting substrate having a major surface and a back side, a first layer formed on the back side, and a second layer formed on the first layer. Aluminum nitride crystal is then grown onto the major surface of the starting substrate by vapor deposition. The first layer is made of a substance that at the temperatures at which the aluminum nitride crystal is grown is less liable to sublimate than the starting substrate. The second layer is made of a substance whose thermal conductivity is higher than that of the first layer.

15 Claims, 9 Drawing Sheets

U.S. PATENT DOCUMENTS

| | | | |
|---|---|---|---|
| 2003/0213964 A1* | 11/2003 | Flynn et al. | 257/85 |
| 2007/0101932 A1* | 5/2007 | Schowalter et al. | 117/952 |
| 2008/0182092 A1* | 7/2008 | Bondokov et al. | 428/220 |

FOREIGN PATENT DOCUMENTS

| | | |
|---|---|---|
| JP | H11-510781 A | 9/1999 |
| JP | 2004-502298 A | 1/2004 |
| JP | 2005-247681 A | 9/2005 |
| JP | 2005-343722 A | 12/2005 |
| JP | 2006-290676 A | 10/2006 |
| WO | WO-02-01608 A2 | 1/2002 |
| WO | WO-2008-088838 A1 | 7/2008 |

OTHER PUBLICATIONS

J.H. Edger et al., "Bulk AlN Crystal Growth: Self-Seeding on 6H-SiC Subatrates," Journal of Crystal Growth, Journal of Crystal Growth, Dec. 1, 2002, vol. 246, No. 3-4, pp. 187-193, Elsevier, NL.

David R. Lide, ed., "Physical Constants of Inorganic Compounds," CRC Handbook of Chemistry and Physics, Jan. 1, 1990, pp. 4-99, CRC Press, Boca Raton.

David R. Lide, ed., "Physical Constants of Inorganic Compounds," CRC Handbook of Chemistry and Physics, Jan. 1, 1990, pp. 4-41, CRC Press, Boca Raton.

* cited by examiner

METHOD FOR GROWING ALUMINUM NITRIDE CRYSTAL, PROCESS FOR PRODUCING ALUMINUM NITRIDE CRYSTAL, AND ALUMINUM NITRIDE CRYSTAL

TECHNICAL FIELD

The present invention relates to methods of growing aluminum nitride crystal, to methods of manufacturing aluminum nitride crystal, and to aluminum nitride crystal.

BACKGROUND ART

Aluminum nitride (AlN) crystal has received attention as a substrate material for optoelectronic and other semiconductor devices because it has a broad energy bandgap of 6.2 eV, a high thermal conductivity of about 3.3 $WK^{-1} cm^{-1}$, and high electrical resistance.

As means to grow aluminum nitride crystal as such, the vapor-phase technique of sublimation deposition is for example employed. Growth of aluminum nitride crystal by sublimation deposition is carried out by the following steps for example. Namely, a polycrystalline aluminum nitride source material is placed in the lower part of a growth chamber, and a starting substrate is set onto a susceptor in the upper part of the growth chamber, so that the substrate and the polycrystalline aluminum nitride source material face each other. The polycrystalline aluminum nitride source material is then heated to a temperature at which the polycrystalline aluminum nitride source material sublimates. The heating sublimates the polycrystalline aluminum nitride source material, producing sublimation gases, and monocrystalline aluminum nitride grows onto the surface of the starting substrate emplaced where the temperature is lower than that of the polycrystalline aluminum nitride source material.

Thus, between the starting substrate and the polycrystalline aluminum nitride source material there is a temperature gradient (temperature difference) where the temperature drops heading from the starting substrate to the polycrystalline aluminum nitride source material. Therefore, between the starting substrate and the susceptor also there is a temperature gradient where the temperature drops heading from the starting substrate to the susceptor, and within the starting substrate as well there is a temperature gradient where the temperature drops heading from the surface opposing the polycrystalline aluminum nitride source material to the surface opposing the susceptor. If between the starting substrate and the susceptor a gap appears, the back side of the starting substrate will incur exposure to the aluminum-nitride-crystal growth atmosphere, whereby due to the just-noted temperature gradients the atoms constituting the starting substrate will sublimate and end up recrystallizing from the starting substrate onto the susceptor, and from high-temperature areas into low-temperature areas within the starting substrate. Progression of this sublimation and recrystallization leads to the occurrence of holes penetrating the starting substrate. Should the sublimation progress further, it can happen that atoms constituting the aluminum nitride crystal grown onto the starting substrate are transported to low-temperature areas of the starting substrate, susceptor, etc. Holes can as a consequence occur in the aluminum nitride crystal grown onto the front side of the starting substrate. Accordingly, preventing sublimation of starting substrates to minimize occurrence of holes in the starting substrates has become a subject of concern.

As technology for thus preventing sublimation of a starting substrate, Japanese Unexamined Pat. App. Pub. No. 2006-290676 (Patent Document 1), for example, describes employing an alumina-based adhesive for high temperatures to adhere the starting substrate to the susceptor. The high-temperature adhesive is said to demonstrate sufficient strength even at high temperatures of 1000° C. or more.

Further, Japanese Unexamined Pat. App. Pub. No. H11-510781 (Patent Document 2), describes a coating, consisting of a metal and metal compound, being formed on the back side of a starting substrate.

In addition, Japanese Unexamined Pat. App. Pub. No. 2005-247681 (Patent Document 3) describes a process in which a metal material is disposed atop a graphite pedestal, a starting substrate is arranged on the metal material, and a pressing member is placed onto the starting substrate, and with the pressing member, at a high temperature of at least 1700° C., a high pressure of not more than 87.5 kPa is applied to the graphite pedestal, metal material, and starting substrate to fix and unify them. The metal material is stated to be at least one material selected from titanium, vanadium and zirconium.

Japanese Unexamined Pat. App. Pub. No. H09-268096 (Patent Document 4), meanwhile, describes coating with a protective layer the surface(s) of a starting substrate other than the face on which single crystal is grown. The protective layer is stated to be made of at least one substance selected from tantalum, tungsten, niobium, molybdenum, rhenium, osmium, iridium, and their carbides, borides and nitrides. Employing an adhesive to affix the protective layer to the pedestal is also disclosed.

Patent Document 1: Japanese Unexamined Pat. App. Pub. No. 2006-290676
Patent Document 2: Japanese Unexamined Pat. App. Pub. No. H11-510781
Patent Document 3: Japanese Unexamined Pat. App. Pub. No. 2005-247681
Patent Document 4: Japanese Unexamined Pat. App. Pub. No. H09-268096

DISCLOSURE OF INVENTION

Problem Invention is to Solve

If, however, the radiant heat transfer of the adhesive, the protective layer, and the susceptor (pedestal) employed according to Patent Documents 1 to 4 is poor, heat will build up in the starting substrate. Heat accumulation in the starting substrate can lead to the adhesive, the protective layer, and the susceptor becoming liable to separate from the back side of the starting substrate, owing to causes including their difference in thermal expansion coefficient from that of the starting substrate, which can leave the back side of the starting substrate exposed to the aluminum-nitride-crystal growth atmosphere. If that happens, on account of the temperature of the starting substrate being high, sublimation of the starting substrate will advance pronouncedly, such that aluminum nitride crystal that is grown onto the starting substrate can become perforated with holes.

Meanwhile, in order to minimize sublimation of starting substrate, lowering the temperature of the polycrystalline aluminum nitride source material is conceivable. The problem with lowering the temperature of the polycrystalline aluminum nitride source material, however, is that doing so lessens the temperature gradient between the polycrystalline aluminum nitride source material and the starting substrate, thereby slowing the growth rate at which aluminum nitride crystal is grown onto the starting substrate.

Accordingly, the present invention is the provision of a method of growing aluminum nitride crystal, of a method of manufacturing aluminum nitride crystal, and of aluminum nitride crystal, wherein by preventing sublimation of the starting substrate in growing aluminum nitride crystal, aluminum nitride crystal of excellent crystallinity is grown and the aluminum-nitride-crystal growth rate can be improved as well.

Means for Resolving the Problem

An aluminum nitride crystal growth method of the present invention is provided with the following steps. To begin with, a laminar baseplate is prepared, furnished with a starting substrate having a major surface and a back side on the reverse side from the major surface, a first layer formed on the back side, and a second layer formed on the first layer. Aluminum nitride crystal is then grown onto the major surface of the starting substrate by vapor deposition. The first layer is made of a substance that at the temperatures at which the aluminum nitride crystal is grown is less liable to sublimate than the starting substrate. The second layer is made of a substance whose thermal conductivity is higher than that of the first layer.

In accordance with an aluminum nitride crystal growth method of the present invention, the fact that the first layer is made of a substance that is less liable to sublimate than the starting substrate prevents, in growing aluminum nitride crystal, the first layer from peeing off the starting substrate, as well as the first layer from vanishing such as would expose the starting substrate through the first layer. Therefore, the starting substrate is prevented from being exposed to the atmosphere in which the aluminum nitride crystal is grown.

In addition, inasmuch as the second layer is made of a substance whose thermal conductivity is higher than that of the first layer, the radiant heat transfer of the second layer is higher than that of the first layer. The second layer therefore disperses to outside of the starting substrate heat that the starting substrate has received when aluminum nitride crystal is grown, and thus is effective to cool the starting substrate. Buildup of heat in the starting substrate can thus be minimized. As a result, the temperature gradient between the susceptor, located in a region within the reactor for growing aluminum nitride crystal where the temperature is low, and the starting substrate can be lessened, therefore making it possible to control sublimation of the starting substrate to a minimum.

The fact that the laminar baseplate is furnished with the second layer that heightens the effectiveness with which the starting substrate cools allows the temperature at which the source material for the aluminum nitride crystal is heated to be set high. The temperature gradient between the source material and the starting substrate can therefore be enlarged, thus allowing the aluminum-nitride-crystal growth rate to be improved.

In the aluminum-nitride-crystal growth method described above, growth of the aluminum nitride crystal preferably is conducted with the laminar baseplate having been loaded onto the susceptor, wherein the second layer is made of a substance whose thermal conductivity is higher than that of the susceptor.

Because the second layer is made of a substance whose thermal conductivity is higher than that of the susceptor, the radiant heat transfer of the second layer is higher than that of the susceptor. This allows further minimizing of heat buildup in the starting substrate, and makes it possible to lessen further the temperature gradient between the starting substrate and the susceptor. Accordingly, sublimation of the starting substrate can be further controlled to a minimum.

And the fact that the heating temperature of the aluminum-nitride-crystal source material can be set higher allows the aluminum-nitride-crystal growth rate to be further improved.

In the foregoing aluminum-nitride-crystal growth method, the above-described preparation step preferably includes a substep of arranging on the back side of the starting substrate a blend in which a powder and a solvent have been mixed together, and disposing the second layer onto the blend, and a substep of sintering the blend in order to make it into the first layer.

This enables, different from Patent Document 3—in which by physical vapor deposition or a similar process a metal material is sandwiched in between a starting substrate and a pedestal and is hot-press adhered through the surface on the substrate side where the crystal is grown, by the use of a pressing member at large pressure and high temperature—the first layer to be formed without employing a pressing member or the like, or even if a pressing member is utilized, at smaller pressure and lower temperature. Therefore, among other advantages, occurrence of contamination on the aluminum-nitride-crystal growth surface can be prevented, chemical reaction between the aluminum-nitride-crystal growth surface and a pressing member can be prevented, and occurrence of a damaged layer on the aluminum-nitride-crystal growth surface can be prevented, enabling growth of aluminum nitride crystal of excellent crystallinity. Moreover, inasmuch as a pressing member is not employed, the first layer can be formed in a simplified way. A laminar baseplate in which the starting substrate and the second layer are made integral via the first layer can therefore be readily obtained.

In the aforedescribed aluminum-nitride-crystal growth method, it is preferable that the starting substrate be an aluminum nitride substrate, and that the aforementioned powder be monocrystalline aluminum nitride.

In the foregoing aluminum-nitride-crystal growth method, it is preferable that the starting substrate be an aluminum nitride substrate, and that the aforementioned powder be a powder of one or more substances selected from the group consisting of polycrystalline aluminum nitride, aluminum nitride ceramics, and aluminum nitride compounds.

Inasmuch as the aforementioned mixture thereby contains the same atomic elements as the starting substrate, sintering the blend allows a first layer to be formed whose adhesiveness to the starting substrate is improved. Since the starting substrate and the first layer can therefore be strongly adhered fast together, the first layer can be effectively prevented from peeling away from the starting substrate.

In the aluminum-nitride-crystal growth method given above, it is preferable that the aforementioned powder be a powder of one or more substances selected from the group consisting of zirconium boride, titanium boride, tantalum boride, niobium boride, molybdenum boride and chromium boride.

Since the borides just listed are high-melting-point, they allow a highly heat-resistant first layer to be formed. The starting substrate can therefore be effectively prevented by the first layer from sublimating, especially in instances in which the aluminum nitride crystal is grown at high temperature.

In the foregoing aluminum-nitride-crystal growth method, it is preferable that the starting substrate be a silicon carbide substrate and that the powder contain carbon atoms.

Inasmuch as the aforementioned mixture thereby contains the same atomic elements as the starting substrate, sintering the blend allows a first layer to be formed whose adhesiveness to the starting substrate is improved. Since the starting substrate and the first layer can therefore be strongly adhered fast together, the first layer can be effectively prevented from peeling away from the starting substrate.

In the aluminum-nitride-crystal growth method set forth above, the aforementioned solvent preferably is made by mixing together an organic substance, a resin, and an aromatic alcohol.

In the foregoing aluminum-nitride-crystal growth method, the aforementioned solvent preferably is made by mixing together acetone, formalin (formaldehyde), furfuryl alcohol, and a polyimide resin.

Since a blend in which the powder is mixed together with this solvent can thereby be rendered into paste form, the blend is readily contacted onto the starting substrate. This makes it possible to contact the blend evenly onto the back side of the starting substrate, thus allowing a first layer able to protect the entire back side of the starting substrate to be readily formed.

In the aluminum-nitride-crystal growth method set forth above, the second layer preferably contains carbon atoms. Likewise, in the aluminum-nitride-crystal growth method set forth above, the second layer preferably contains aluminum nitride.

One benefit of this is that it lends the second layer a heat resistance of approximately 3000° C. within an inert gas atmosphere in implementations in which the vapor deposition process is sublimation, allowing the heat resistance of the second layer to be improved.

In the foregoing aluminum-nitride-crystal growth method, the thickness of the second layer preferably is from 10 μm to 10 cm.

The heat-dissipating effectiveness of the second layer can be enhanced when it is at least 10 μm. Being not more than 10 cm allows the second layer to be prevented from separating away from the first layer.

In the aluminum-nitride-crystal growth method described above, preferably the absolute value of the difference between the thermal expansion coefficient of the starting substrate and the thermal expansion coefficient of the first layer is not greater than $1.0 \times 10^{-5}$ ° $C.^{-1}$, and the absolute value of the difference between the thermal expansion coefficient of the starting substrate and the thermal expansion coefficient of the second layer is not greater than $1.0 \times 10^{-5}$ ° $C.^{-1}$, in a temperature range of from room temperature to 2300° C.

The difference between the thermal expansion coefficient of the starting substrate and the thermal expansion coefficient the first layer, and the difference between the thermal expansion coefficient of the starting substrate and the thermal expansion coefficient of the second layer can thereby be lessened. Therefore, peeling away of the first and second layers from the starting substrate during temperature ramp-up in order to launch aluminum nitride crystal growth, and during cooling down to room temperature following conclusion of the aluminum nitride crystal growth can be minimized.

In the aluminum-nitride-crystal growth method set forth above, preferably the above-described preparation step includes a substep of forming a metal coating onto the back side of the starting substrate by evaporation deposition.

Because the radiant heat transfer of the metal coating is extremely high and its thermal resistance at its interface with the starting substrate is low, the heat-dissipating effectiveness of the starting substrate can be extraordinarily improved. Furthermore, after it has been grown, etching the aluminum nitride crystal in an acid solution allows at least the first layer to be readily cleared away from the aluminum nitride crystal.

In the foregoing aluminum-nitride-crystal growth method, preferably the thickness of the metal coating is between 1 μm and 200 μm.

The heat-dissipating effectiveness of the metal coating can be enhanced when it is at least 1 μm. Being not more than 200 μm allows the metal coating to be prevented from separating away from the starting substrate.

In the aluminum nitride crystal set forth above, preferably the metal coating is made of one or more substances selected from the group consisting of tungsten (W), tantalum (Ta) and molybdenum (Mo).

Because the radiant heat transfer of the just-listed materials is extraordinarily high and their thermal resistance at their interface with the starting substrate is extraordinarily low, the heat-dissipating effectiveness of the starting substrate can be effectively improved.

An aluminum-nitride-crystal manufacturing method of the present invention is provided with a step of growing aluminum nitride crystal by any of the aluminum nitride crystal growth methods set forth in the foregoing, and a step of removing at least the first layer.

In accordance with an aluminum-nitride-crystal manufacturing method of the present invention, buildup of heat in starting substrate is prevented by the second layer, whereby sublimation of the starting substrate is restrained. Occurrence of holes in the aluminum nitride can therefore be controlled to a minimum, thus making it possible to manufacture aluminum nitride crystal of excellent crystallinity. Moreover, aluminum nitride crystal can be grown with an improved growth rate, allowing the aluminum nitride crystal to be efficiently manufactured.

Aluminum nitride crystal of the present invention is manufactured by any of the aluminum-nitride-crystal manufacturing methods set forth in the foregoing.

In accordance with aluminum nitride crystal of the present invention, the aluminum nitride crystal is grown with the starting substrate prevented by the second layer from sublimating. On that account the crystallinity of the aluminum nitride crystal is excellent.

Effects of the Invention

In accordance with aluminum-nitride-crystal growth methods of the present invention, aluminum-nitride-crystal manufacturing methods of the present invention, and aluminum nitride crystal of the present invention, by preventing sublimation of the starting substrate in growing aluminum nitride crystal, aluminum nitride crystal of excellent crystallinity is grown and at the same time the aluminum-nitride-crystal growth rate can be improved.

LEGEND

10: laminar baseplate; 11: starting substrate; 11a, 12a, 14a: major surface; 11b, 12b, 14b: back side; 12: first layer; 13: second layer; 14: metal coating; 17: source material; 20, 21: aluminum nitride crystal; 115: crucible; 115c: ventilation port; 116: susceptor; 119: heating component; 121a, 121b: radiation thermometer; 122: reaction vessel; 122a: nitrogen gas introduction port; 122b: nitrogen gas exhaust port; 123: RF power heating coil; H: thickness

BEST MODE FOR CARRYING OUT THE INVENTION

Below, based on the drawings a description of modes of embodying the present invention will be made.
Embodying Mode 1

Figure 1:
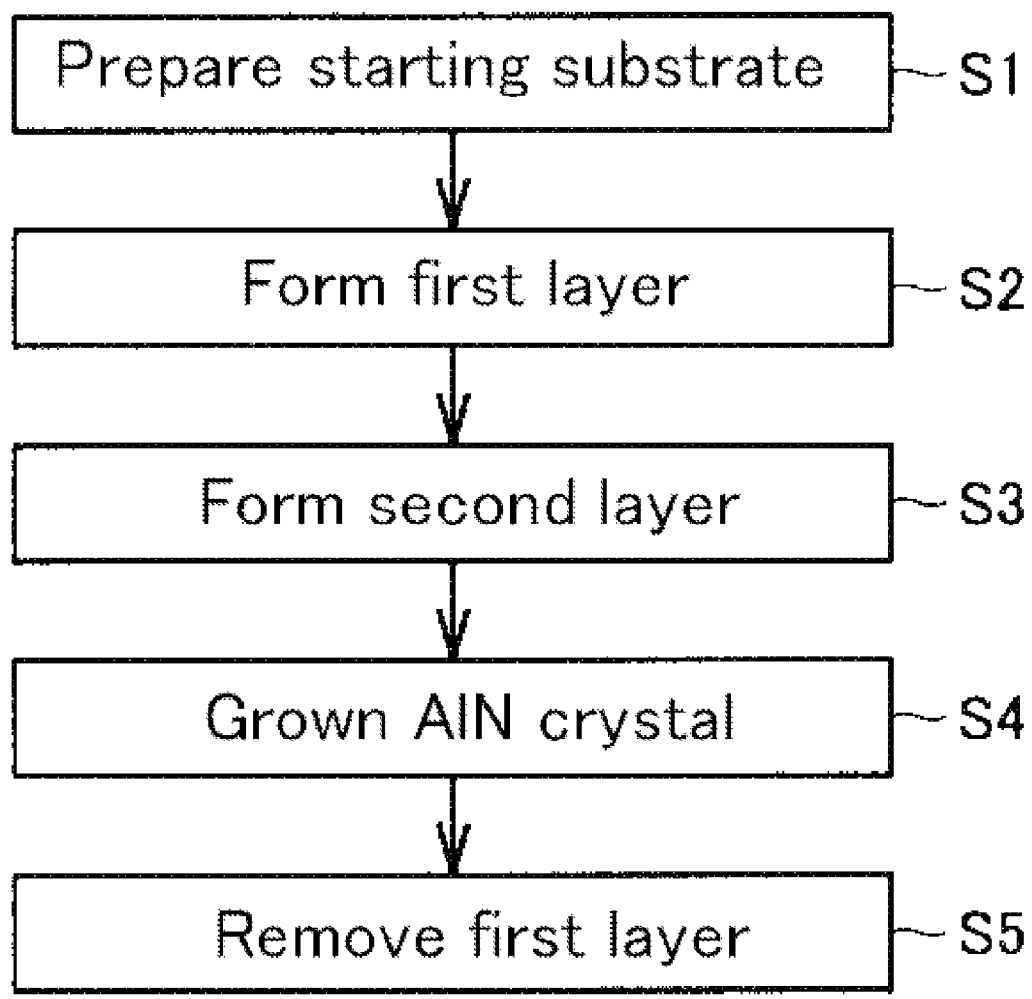
FIG. 1 is a flowchart presenting an aluminum-nitride-crystal growth method and manufacturing method in Embodying Mode 1 of the present invention.

FIG. 1 is a flowchart presenting an aluminum-nitride-crystal growth method and manufacturing method in the present embodying mode. With reference to FIG. 1, a description of aluminum nitride crystal and manufacturing method in the present embodying mode will be made.

Figure 2:
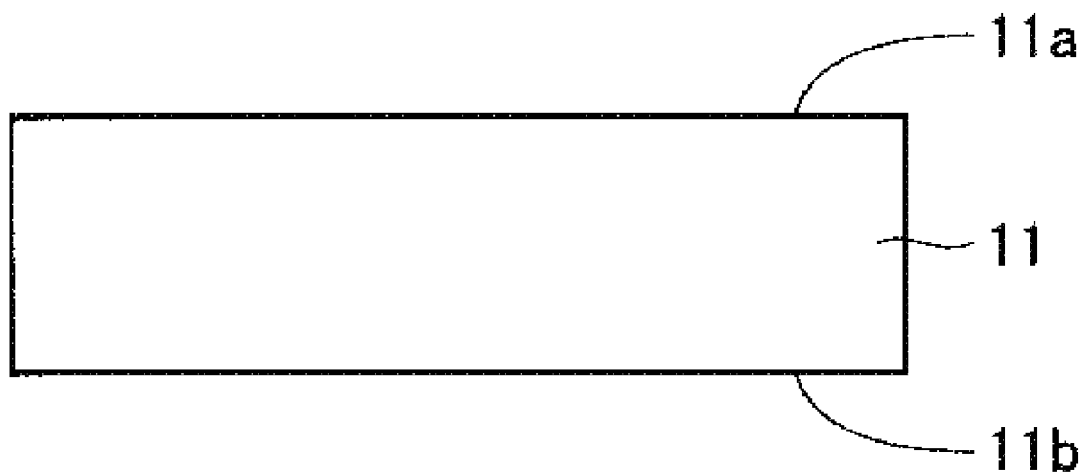
FIG. 2 is a schematic side view representing a starting substrate in Embodying Mode 1 of the present invention.

FIG. 2 is a schematic side view representing a starting substrate in Embodying Mode 1 of the present invention. As indicated in FIGS. 1 and 2, to begin with, a starting substrate 11 having a major surface 11a and a back side 11b on the reverse side from the major surface 11a is prepared (Step S1). The starting substrate 11 is not particularly limited, but from the perspective of growing aluminum nitride of favorable crystallinity preferably is an aluminum nitride substrate and silicon carbide substrate.

It is preferable that the thickness of the starting substrate 11 be, for example, between 100 μm and 5 mm. This is because the temperature gradient in the starting substrate 11 if it has a thickness in this range will not be overly large.

Figure 3:
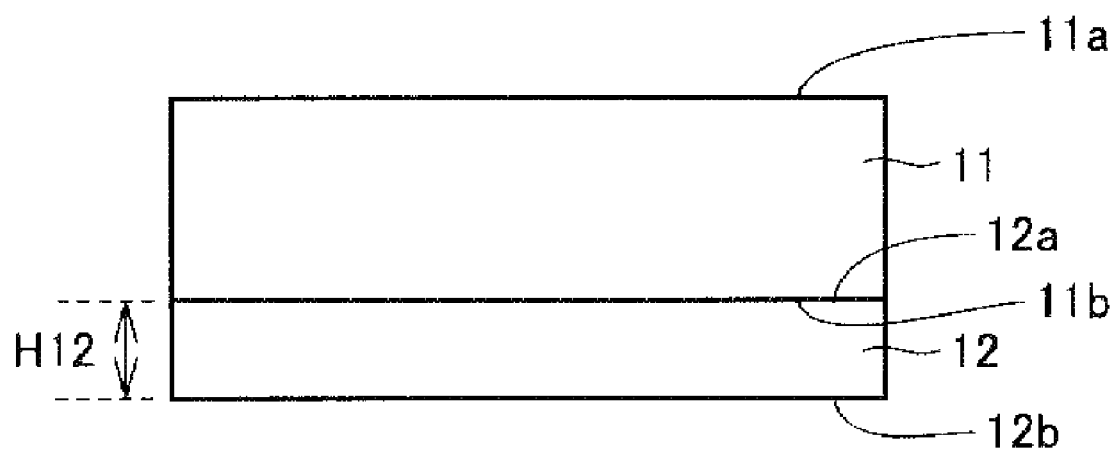
FIG. 3 is a schematic side view diagramming a situation in which the first layer has been formed, in Embodying Mode 1 of the present invention.

FIG. 3 is a schematic side view diagramming a situation in which a first layer 12 has been formed, in the present embodying mode. As indicated in FIGS. 1 and 3, the first layer 12 is formed so as to cover the back side 11b of the starting substrate 11 (Step S2). This first layer 12 is made of a substance that is less liable to sublimate than the starting substrate 11 at the temperatures at which the aluminum nitride crystal 20 is grown. The first layer 12 is formed in order to protect the starting substrate 11, and in order to bond the starting substrate 11 and the second layer 13.

The thickness H12 of the first layer 12 is preferably between 50 μm and 10 mm, more preferably between 500 μm and 5 mm. The thickness H being 50 μm or greater makes it possible to prevent the first layer 12 from peeling away from the starting substrate 11, and prevent the first layer 12 from vanishing such as would expose the starting substrate 11 through the first layer 12, when the aluminum nitride crystal is grown (cf. FIG. 5). A first layer 12 that can withstand aluminum nitride crystal growth for extensive durations at high temperatures can therefore be formed. If it is 500 μm or greater, the first layer 12 can be prevented all the more from peeling and vanishing during the aluminum nitride crystal growth. Meanwhile, if the thickness H12 of the first layer 12, made from a substance less liable to sublimate than the starting substrate, is not greater than 10 mm, handling is facilitated in that it allows the laminar baseplate 10 (cf. FIG. 4) on which the first layer 12 is formed to be readily emplaced in the reactor employed to grow the aluminum nitride crystal. A thickness of not greater than 5 mm further facilitates handling in the situation in which the starting substrate 11 and the first layer 12 have been provided.

The first layer 12 is made from a substance less liable to sublimate than the starting substrate at the temperatures at which the aluminum nitride crystal 20 is grown. Herein, the aluminum nitride crystal 20 growth temperature is, for example, 1700° C. to 2000° C. A substance less liable to sublimate than the starting substrate 11 means, for example, a substance whose melting point is the same as or higher than that of the starting substrate 11.

To be specific, for the first layer 12 it is preferable that the following steps be carried out. To begin with, a powder and a solvent are mixed together to form a blend. The blend, being the powder and solvent having been mixed together, is then contacted onto the back side 11b of the starting substrate 11; and by sintering the blend, the blend hardens to form the first layer 12 covering the back side 11b of the starting substrate 11.

The method whereby the blend is contacted onto the back side 11b may be by spreading the blend onto the back side 11b, or by immersing the back side 11b into mixture having been pooled.

Furthermore, in sintering the blend, it is preferable that the blend, having been placed onto the back side 11b of the starting substrate 11, be sintered without applying pressure from above it. That way, a pressing member for applying pressure is not used, resulting in advantages that include preventing contamination of the grown aluminum nitride crystal growth surface, preventing chemical reaction between the grown aluminum nitride crystal growth surface and such a pressing member, and preventing occurrence of a damaged layer on the growth surface where the aluminum nitride crystal is grown, allowing aluminum nitride crystal of excellent crystallinity to be grown.

Here, a second layer 13 (cf. FIG. 4) may be arranged onto the blend, and a pressing member placed onto the second layer 13. In that case, the material constituting the pressing member preferably is silicon (Si) or a like material, and the pressure applied by the pressing member preferably is 10 g/cm² to 1000 g/cm².

Also, in sintering the blend, the first layer 12 may be formed by, for example, feeding the starting substrate 11, with the blend having been contacted onto its back side 11b, into a heating furnace. Here, the atmosphere under which the blend is sintered is not particularly limited—the process may be carried out in atmosphere—but employing a vacuum heating furnace is preferable since it allows air in gaps between the starting substrate and the blend to be deaerated. The temperature at which the blend is sintered is for example 200° C. to 500° C.

The absolute value of the difference between the thermal expansion coefficient of the starting substrate 11 and the thermal expansion coefficient of the first layer 12, in a temperature range of from room temperature to 2300° C., preferably is not greater than $1.0 \times 10^{-5}$ °C.$^{-1}$. Since the difference between the thermal expansion coefficient of the starting substrate 11 and the thermal expansion coefficient of the first layer 12 is minimal, during temperature ramp-up at the start of aluminum nitride crystal growth, and during cool-down to room temperature after growth of the aluminum nitride crystal is finished, stress owing to difference in thermal expansion coefficient can be reduced. Accordingly, peeling away of the first layer 12b from the starting substrate 11 can be restrained, therefore making it possible control to a minimum the occurrence of holes in the grown aluminum nitride crystal. It should be noted that the absolute value of the difference between the thermal expansion coefficient of the starting substrate 11 and the thermal expansion coefficient of the first layer 12 preferably is as small as possible; the difference may be zero. Also, the temperature distribution during the aluminum nitride crystal growth takes place in a range of from room temperature to not more than 2300° C. Room temperature is exemplarily some 20° C.

The powder preferably contains atoms of the material constituting the starting substrate 11. Specifically, if the starting substrate 11 is an aluminum nitride substrate, then the powder preferably is a powder of one or more substances selected from the group consisting of monocrystalline aluminum nitride, polycrystalline aluminum nitride, aluminum nitride ceramics and aluminum nitride compounds. In implementations in which the starting substrate 11 is a silicon carbide substrate, the powder preferably contains carbon atoms. Inasmuch as in that case the powder contains the same atoms as the starting substrate 11, sintering a blend in which the powder and a solvent have been mixed together reduces gaps between it and the starting substrate 11, allowing a first layer 12 to be formed in which the cohesion between it and the starting substrate is improved. The fact that the starting substrate 11 and the first layer 12 can therefore be firmly adhered fast ensures that the first layer 12 is effectively kept from peeling away from the starting substrate 11. The mixing-in of impurities when aluminum nitride crystal is grown for prolonged periods can also be prevented.

The powder, furthermore, may be a powder of one or more substances selected from the group consisting of zirconium boride, titanium boride, tantalum boride, niobium boride, molybdenum boride and chromium boride. The fact that these borides are high-melting-point allows a highly heat-resistant first layer 12 to be formed. The starting substrate 11 can therefore be further prevented by the first layer 12 from sublimating, especially when the aluminum nitride crystal (cf. FIG. 5) is grown at high temperature.

A further preferred condition is that the grain size of the powder be between 0.5 μm and 100 μm, more preferably between 0.5 μm and 10 μm. Being not greater than 100 μm allows a first layer 12 that is in minute, accurate, and firm contact with the starting substrate 11 to be formed. Owing to the large area of contact with the starting substrate 11, heat that the starting substrate 11 has received is readily transmitted to the second layer 13, further ensuring that buildup of heat in the starting substrate 11 is kept to a minimum. Being not greater than 10 μm allows a first layer 12 that is in more minute, accurate, and firm contact with the starting substrate 11 to be formed. Meanwhile, the grain size being not less than 0.5 μm guarantees that when the powder is mixed with the solvent, a uniform mixture will be created without occurrence of sedimentation, separation, or the like.

The solvent preferably is made by mixing together an organic substance, a resin, and an aromatic alcohol. Examples of what can be utilized as the organic substance include acetone, isopropyl alcohol, and formalin (formaldehyde). Examples of what can be utilized as the resin include polyimide resins, epoxy resins, and phenol resins. Examples of what can be utilized as the aromatic alcohol include furfuryl alcohol and cinnamyl alcohol. A blend in which a powder is mixed into this solvent can be put into paste form, thus making it easier to contact the blend onto the starting substrate. The fact that the blend can therefore be uniformly contacted onto the back side 11b of the starting substrate 11 allows a first layer 12 able to protect the entire back side 11b of the starting substrate 11 to be readily formed.

Utilizing solvent made by mixing together acetone, formalin (formaldehyde), furfuryl alcohol, and a polyimide resin is especially preferable. Because this implementation is advantageous in terms of simplicity and mass productivity, it can reduce costs.

Figure 4:
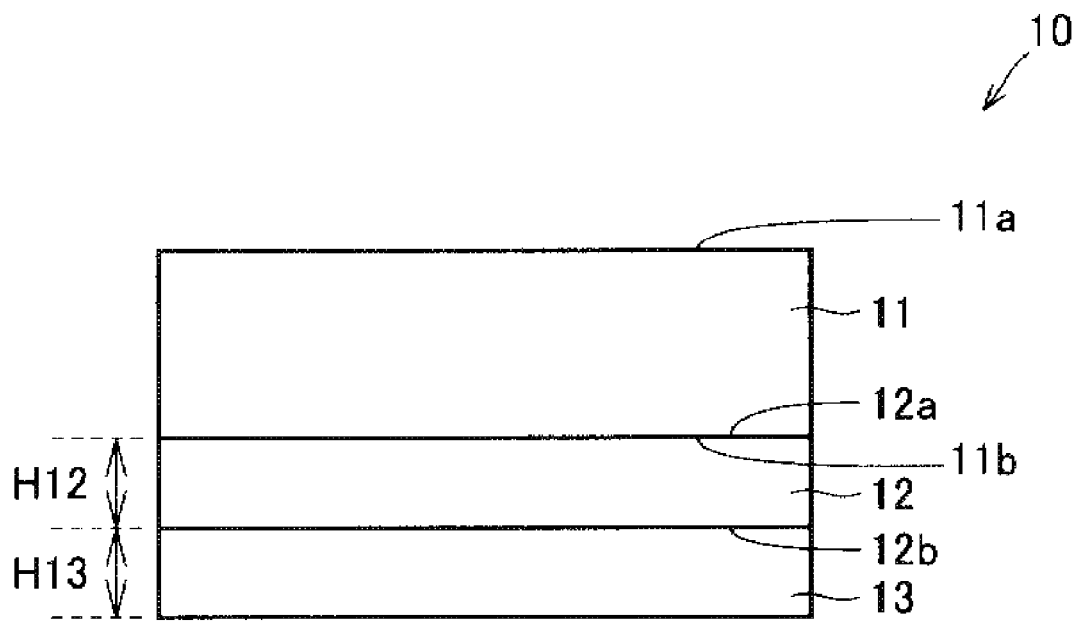
FIG. 4 is a schematic side view diagramming a situation in which the second layer has been formed, in Embodying Mode 1 of the present invention.

FIG. 4 is a schematic side view diagramming a situation in which the second layer 13 has been formed, in the present embodying mode. As indicated in FIGS. 1 and 4, the second layer 13 is formed so as to cover the back side 12b of the first layer 12 (Step S3). The second layer 13 is formed for the purpose of dissipating to outside of the starting substrate 11 heat that the starting substrate 11 has received.

The thickness H13 of the second layer 13 is preferably between 10 μm and 10 cm, more preferably between 50 μm and 10 cm, even more preferably between 100 μm and 5 cm. The thickness H13 being not less than 10 μm enhances the cooling effect whereby heat is dispersed from the starting substrate 11 by the second layer 13. It being not less than 50 μm further enhances the cooling effect whereby heat is dispersed from the starting substrate 11 by the second layer 13. In implementations in which the thickness is not less than 100 μm, the cooling effect on the starting substrate 11 having the second layer 13 is all the more pronounced. Meanwhile, the thickness not being greater than 10 cm ensures that the second layer 13 is kept from peeling from the first layer 12. Not being greater than 5 cm further ensures that the second layer 13 is kept from peeling from the first layer 12.

Figure 6:
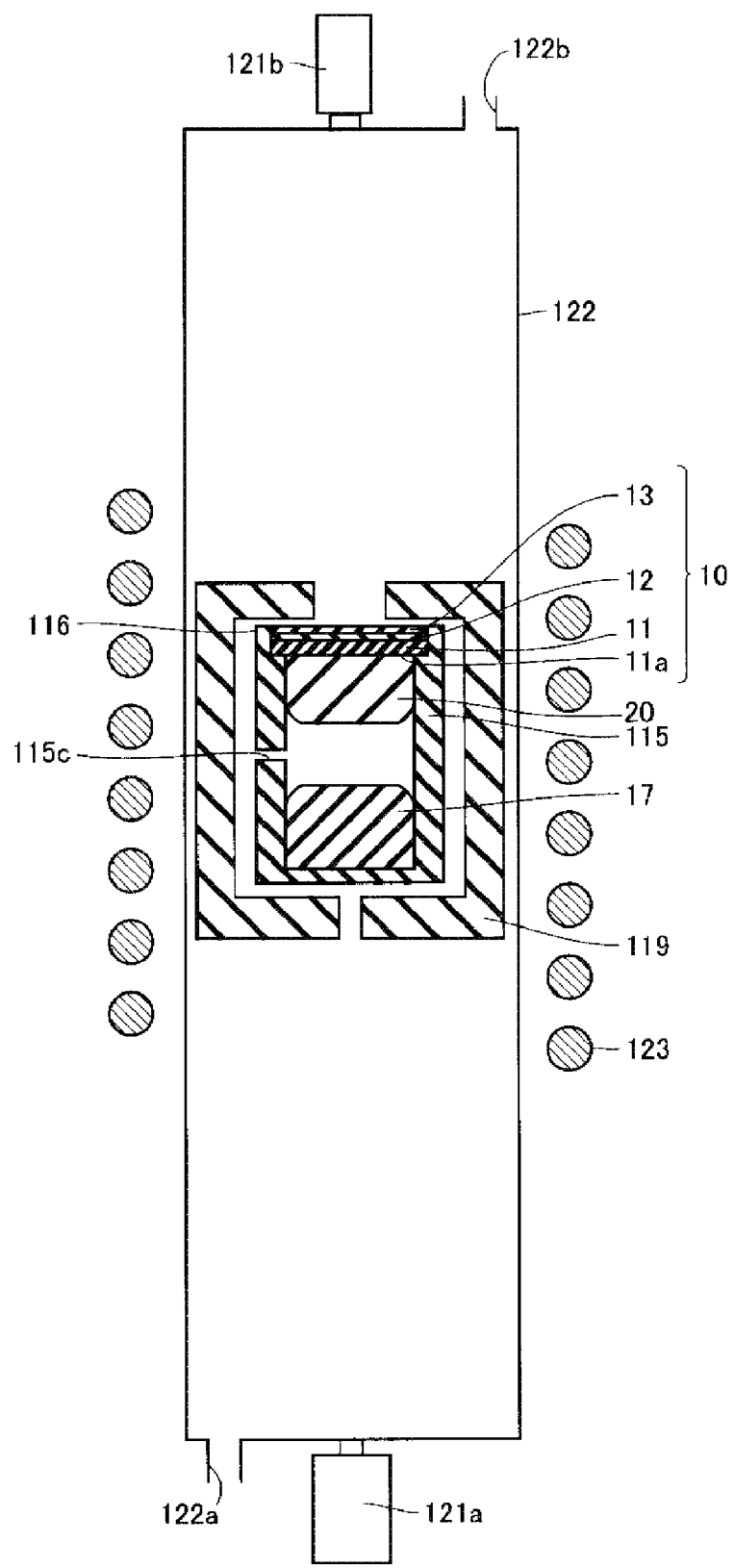
FIG. 6 is an outline diagram representing a reactor for growing aluminum nitride crystal by sublimation deposition, in Embodying Mode 1 of the present invention.

It is preferable that the second layer 13 be made from a substance whose thermal conductivity is higher than that of the first layer 12, and that it be made from a substance whose thermal conductivity is higher than that of the susceptor 116 (cf. FIG. 6). The second layer 13 preferably contains at least either carbon atoms or aluminum nitride atoms. These specifications can improve the heat resistance of the second layer 13, with the second layer 13 having a heat resistance of approximately 3000° C. within the inert gas atmosphere in instances where the vapor deposition process is sublimation. In implementations in which the starting substrate 11 is a silicon carbide substrate, the second layer 13 preferably contains carbon atoms; preferably it is a carbon substrate. In implementations in which the starting substrate 11 is an aluminum nitride substrate, the second layer 13 preferably contains aluminum nitride atoms; preferably it is an aluminum nitride ceramic substrate.

The absolute value of the difference between the thermal expansion coefficient of the starting substrate 11 and the thermal expansion coefficient of the second layer 13, in a temperature range of from room temperature to 2300° C., preferably is not greater than $1.0\times10^{-5}$ °C.$^{-1}$. Inasmuch as the difference between the thermal expansion coefficient of the starting substrate 11 and the thermal expansion coefficient of the second layer 13 is minimal, during temperature ramp-up at the start of aluminum nitride crystal growth, and during cool-down to room temperature after growth of the aluminum nitride crystal is finished, stress owing to difference in thermal expansion coefficient can be reduced. Peeling away of the second layer 13 from the starting substrate 11 consequently can be restrained, thus making it possible control to a minimum the occurrence of holes in the grown aluminum nitride crystal. It should be noted that the absolute value of the difference between the thermal expansion coefficient of the starting substrate 11 and the thermal expansion coefficient of the second layer 13 preferably is as small as possible; the difference may be zero.

Meanwhile, the absolute value of the difference between the thermal expansion coefficient of the first layer 12 and the thermal expansion coefficient of the second layer 13, in a temperature range of from room temperature to 2300° C., preferably is not greater than $1.0\times10^{-5}$ °C.$^{-1}$. That way, peeling of the second layer 13 from the first layer 12 can be restrained.

According to the foregoing, a laminar baseplate 10 furnished with a starting substrate 11, a first layer 12 formed on the back side 11b of the starting substrate 11, and a second layer 13 formed on the first layer 12 can be prepared.

It should be understood that in the preceding description, an explanation was made citing as an example a method in which the first layer 12 is formed on the back side 11b of the starting substrate 11, after which the second layer 13 is formed, but the sequence in which these are formed is not particularly limited. For example, the blend that is to become the first layer 12 is arranged onto the back side 11b of the starting substrate 11, and the second layer 13 is placed onto the blend. The blend is thereafter sintered in order to make it into the first layer 12. In this way the second layer 13 may be formed on the back side 11b of the starting substrate 11 with the first layer 12 intervening. In that case the starting substrate 11 and the second layer 13 can be readily bonded by means of the first layer 12, thereby facilitating integration of the starting substrate 11, the first layer 12, and the second layer 13.

Figure 5:
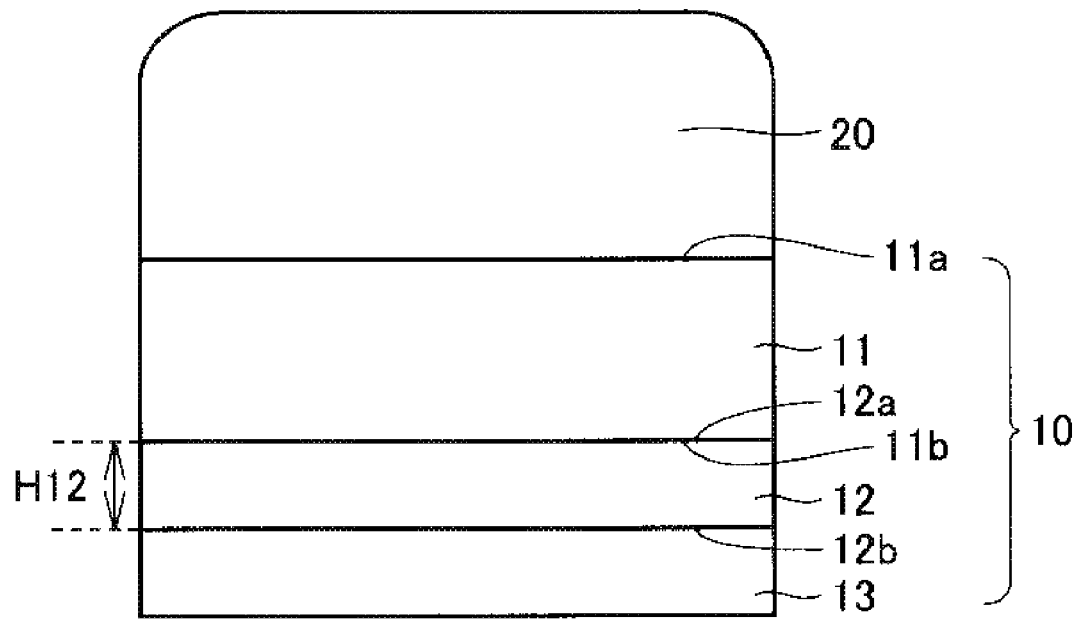
FIG. 5 is a schematic side view diagramming a situation in which aluminum nitride crystal has been grown, in Embodying Mode 1 of the present invention.

FIG. 5 is a schematic side view diagramming a situation in which aluminum nitride crystal 20 has been grown, in the present embodying mode. With the back side 11b of the starting substrate 11 having been covered with the first layer 12 and the second layer 13, as indicated in FIGS. 1 and 5, aluminum nitride crystal 20 is grown by a vapor deposition process onto the major surface 11a of the starting substrate 11 (Step S4).

As long as it is a vapor deposition process, the method whereby the aluminum nitride crystal 20 is grown is not particularly limited; examples of methods that can be adopted include sublimation deposition, hydride vapor-phase epitaxy (HVPE), molecular-beam epitaxy (MBE), and metalorganic chemical vapor deposition (MOCVD). From the perspective of being applied to the crystal growth of aluminum nitride crystal 20 in particular, sublimation deposition is preferable for growing the aluminum nitride crystal 20.

FIG. 6 is an outline diagram representing a reactor for, in the present embodying mode, growing aluminum nitride crystal by sublimation deposition. As indicated in FIG. 6, in the midportion of its reaction vessel 122 this vertical reactor is equipped with a crucible 115 having a ventilation port 115c, and in the upper part of the crucible 115 a susceptor 116 for carrying the laminar baseplate 10 is provided. The susceptor 116 constitutes part of the crucible 115. A heating component 119 is provided encompassing the crucible 115 in a manner such as to secure ventilation from the interior to the exterior of the crucible 115. In addition, an RF-power heating coil 123 for causing the heating component 119 to heat is provided along the midportion of the outer side of the reaction vessel 122. At the ends of the reaction vessel 122, further provided are a nitrogen gas introduction port 122a and a nitrogen gas exhaust port 122b, for flowing nitrogen ($N_2$) gas to the exterior of the crucible 115 in the reaction vessel 122, and radiation thermometers 121a, 121b, for gauging the temperature of the top and bottom sides of the crucible 115.

In the present embodying mode the reactor just described is employed to grow aluminum nitride crystal 20 by sublimation deposition in the following manner. To begin with, a source material 17 is placed into the bottom of the crucible 115, and the laminar baseplate 10 is arranged on the susceptor 116 in the upper part of the crucible 115. After that, while $N_2$ gas is flowed into the reaction vessel 122, the temperature within the crucible 115 is ramped up by employing the RF heating coil 123 to heat the heating component 119, and the temperature at the source-material 17 end of the crucible 115 is held higher than the temperature in the remaining region thereof. The source material 17 is thereby sublimed, causing aluminum nitride crystal to solidify (recrystallize) onto the major surface 11a of the starting substrate 11 to grow aluminum nitride crystal 20.

Herein, in the growth of the aluminum nitride crystal, having the temperature at the source-material 17 end of the crucible 115 be, for example, 1600° C. to 2300° C., and making the temperature of the major surface 11a of the starting substrate 11 in the upper part of the crucible 115 for example 10° C. to 200° C. lower than the temperature at the source-material 17 end yields aluminum nitride crystal of fine crystallinity. What is more, making the temperature of the starting substrate 11 lower by 50° C. to 200° C. than the temperature of the source material 17 enables the aluminum-nitride-crystal growth rate to be improved.

Furthermore, also during the crystal growth, by continuously flowing, so as to be at 100 sccm to 1 slm, nitrogen gas along the outer side of the crucible 115 within the reaction vessel 122, in-mixing of impurities into the aluminum nitride crystal can be reduced.

It should be noted that making the temperature at the source-material 17 end higher than the temperature in the remaining portion of the crucible 115 makes it possible to eliminate, through the ventilation port 115c, impurities inside the crucible 115 during ramp-up of the crucible 115 interior temperature. This makes it possible further to reduce in-mixing of impurities into the aluminum nitride crystal 20.

The foregoing Steps S1 to S4 enable aluminum nitride crystal 20 to be grown. When aluminum nitride crystal 21 (cf. FIG. 7) is to be manufactured utilizing such aluminum nitride crystal 20, the following steps are implemented.

Figure 7:
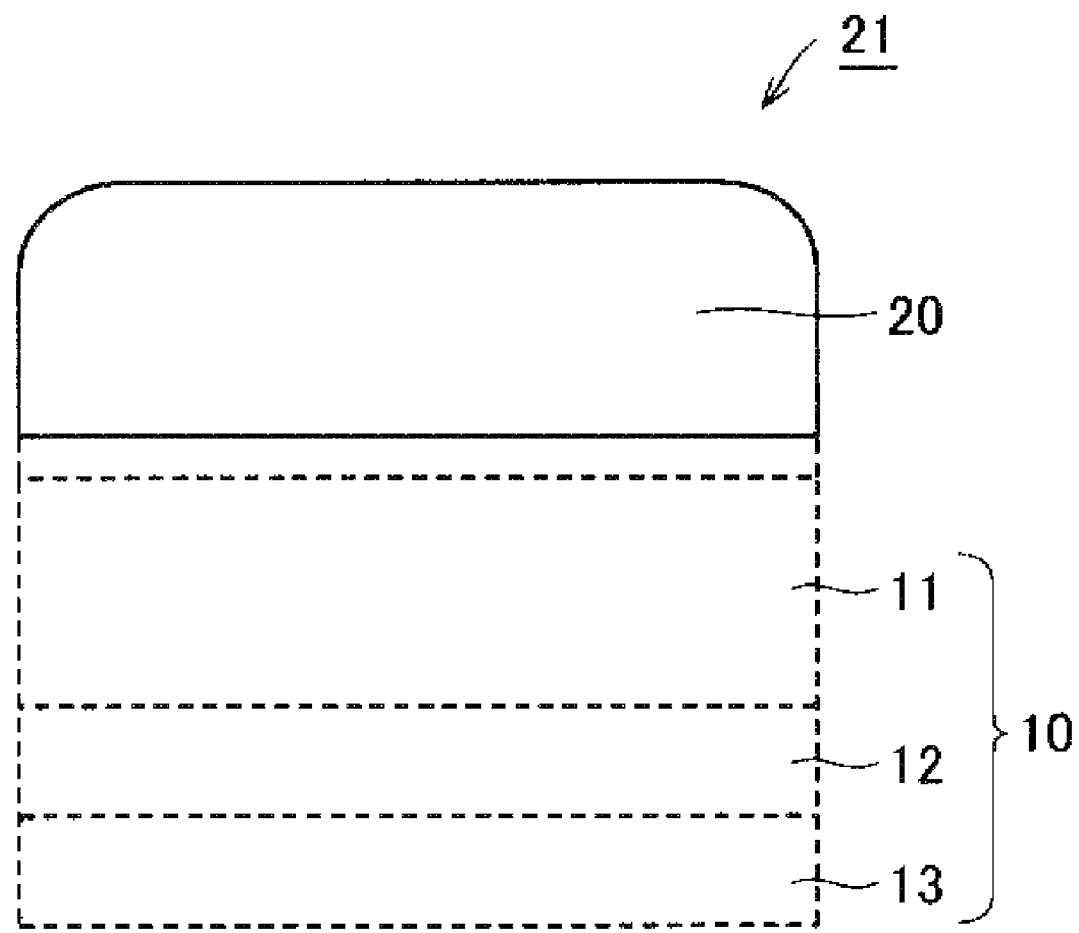
FIG. 7 is a schematic side view diagramming a situation in which at least the first layer has been cleared away, in Embodying Mode 1 of the present invention.

FIG. 7 is a schematic side view diagramming a situation in which at least the first layer 12 has been cleared away, in the present embodying mode. Next, as indicated in FIGS. 1 and 7, at least the first layer 12 is removed from the laminar baseplate 10 and aluminum nitride crystal 20 (Step S5). If the starting substrate 11 is a dissimilar substrate—a material different from aluminum nitride—the starting substrate 11 as well as the first layer 12 are, as indicated in FIG. 7, cleared away. If the starting substrate 11 is an aluminum nitride substrate, it is acceptable to remove the starting substrate 11 as well as the first layer 12, as indicated in FIG. 7, or to remove the first layer 12 alone.

While the method by which removal is performed is not particularly limited, for example, mechanical removal methods such as slicing, grinding or cleaving can be employed. Slicing indicates removing at least the starting substrate 11 mechanically from the aluminum nitride crystal 20 by means such as a slicer having an electroplated diamond wheel with a rim blade. Grinding indicates contacting onto a surface a grindstone while it is being spun and shaving the material off thickness-wise. Cleaving indicates dividing the aluminum nitride crystal 20 along a crystal lattice plane therein. It should be understood that chemical removal means such as etching may be employed.

Carrying out the foregoing Steps S1 to S5 makes it possible to manufacture aluminum nitride crystal 21. Aluminum nitride crystal 21 thus manufactured has a planar form that is, for example, 5 mm or more in diameter or 5 mm or more to a side, and has a thickness of not less than 1 mm. The aluminum nitride crystal 21 is therefore ideally suited to application as substrate for semiconductor devices.

It will be appreciated that when aluminum nitride crystal 20 having a thickness of more than 1 mm is grown, a plurality of aluminum nitride crystal substrates can be sliced from the aluminum nitride crystal 20, 21. Since the aluminum nitride crystal 20, 21 is constituted from a single crystal, it is easily divided. That way, the aluminum nitride crystal substrates, yet with excellent crystallinity, allow costs to be reduced.

As described in the foregoing, in the present embodying mode the method of growing aluminum nitride crystal 20 and the method manufacturing of aluminum nitride crystal 21 utilize a laminar baseplate 10 furnished with a starting substrate 11, a first layer 12 formed on its back side 11b, and a second layer 13 formed on the first layer 12, with the first layer 12 being made from a substance less liable to sublimate than the starting substrate 11 at the aluminum-nitride-crystal growth temperatures.

In accordance with the method of growing aluminum nitride crystal 20 and the method manufacturing of aluminum nitride crystal 21 in the present embodying mode, inasmuch as the second layer 13 is made from a substance whose thermal conductivity is higher than that of the first layer 12, the radiant heat transfer of the second layer 13 is higher than that of the first layer 12. The second layer 13 therefore disperses heat that the starting substrate 11 has received when the aluminum nitride crystal 20 is grown, and thus is effective to cool the starting substrate 11. Accordingly, since buildup of heat in the starting substrate 11 can be minimized, within the reactor for growing the aluminum nitride crystal 20, the temperature gradient between the susceptor 116, located in an area where temperatures are relatively low, and the starting substrate 11 can be lessened.

The fact that the first layer 12 is made of a substance that is less liable to sublimate than the starting substrate 11 ensures that when the aluminum nitride crystal 20 is grown, the first layer 12 is kept from peeling from the starting substrate 11, and that the first layer 12 is prevented from vanishing such as would leave the starting substrate 11 exposed through the first layer 12. Therefore, the starting substrate 11 is kept from being left open to the atmosphere under which the aluminum nitride crystal 20 is grown.

In this way the second layer 13 minimizes heat buildup in the starting substrate 11, while the first layer 12 minimizes exposure of the starting substrate 11 to the atmosphere under which the aluminum nitride crystal 20 is grown. These synergistic effects make it possible to control sublimation of the starting substrate 11 to a minimum. Accordingly, aluminum nitride crystal 20 of excellent crystallinity can be grown. The crystallinity of aluminum nitride crystal 21 that is manufactured utilizing this aluminum nitride crystal 20 may be improved as a result.

Even supposing a gap were to appear between the starting substrate 11 and the susceptor 116, the fact that a first layer 12 less likely than the starting substrate 11 to sublimate has been created ensures that constituent atoms of the starting substrate 11 are prevented from passing the first layer 12 and scattering from the starting substrate 11 to the susceptor 116. And even supposing part of the first layer 12 and the second layer 13 were to peel from the starting substrate 11, heat that the starting substrate 11 receives would be able to escape through the second layer 13. The temperature gradient between the starting substrate 11 and the susceptor 116 is therefore made smaller than what has traditionally been the case, to restrain sublimation of the starting substrate 11. It will be appreciated that even supposing that the first and the second layers 12 and 13 were to peel, over conventional cases where aluminum nitride crystal is grown employing a starting substrate without first and second layers 12 and 13 having been formed on it, cases where the laminar baseplate 10 is utilized to grow the aluminum nitride crystal 20 suspend at the peeling of the part of the first and second layers 12 and 13, in the Step S4 latter stage when the aluminum nitride crystal 20 is grown. Because the point where the starting substrate 11 would sublimate can therefore be delayed, the occurrence of holes penetrating the starting substrate 11 may be minimized.

The fact that the laminar baseplate 10 is furnished with the second layer 13 that enhances the cooling effect on the starting substrate 11 ensures that sublimation of the starting substrate 11 will be minimized even with the heating temperature of the source material 17 for the aluminum nitride crystal 20 set high. The temperature gradient between the source material 17 and the starting substrate 11 can therefore be made large, to improve the aluminum-nitride-crystal 20 growth rate.

In the aluminum-nitride-crystal 20 growth method and aluminum-nitride-crystal 21 manufacturing method described above, the operation (Steps S1 to S3) of preparing the laminar baseplate 10 preferably includes a step arranging a blend being a powder mixed into a solvent onto the back side 11b of the starting substrate 11 and disposing the second layer 13 onto the blend, and a step of sintering the blend in order to make it into the first layer 12.

Because this enables the second layer 13 to be integrated with the starting substrate 11 without employing a pressing member or the like, or even if a pressing member is utilized, at smaller pressure and lower temperature, the laminar baseplate 10 can be created by a simplified method. A laminar baseplate 10 in which the starting substrate 11 and the second layer 13 are rendered integral via the first layer 12 can therefore be readily obtained. And, among other advantages, occurrence of contamination on the surface where the aluminum nitride crystal 20 is grown can be prevented, chemical reaction between the surface where the aluminum nitride crystal 20 is grown and a pressing member can be prevented, and occurrence of a damaged layer on the surface where the aluminum nitride crystal 20 is grown can be prevented, enabling growth of aluminum nitride crystal 20 of excellent crystallinity. A further advantage is that the starting substrate 11 and the second layer 13 can be bonded together firmly via the first layer 12.

Inasmuch as the crystallinity of the thus-obtained aluminum nitride crystal 20, 21 is superior, it can be utilized quite suitably in applications including, for example: optoelectronic devices such as light-emitting diodes and laser diodes; electronic devices such as Schottky barrier diodes, rectifiers, bipolar transistors, field-effect transistors and HEMTs (high electron mobility transistors); semiconductor sensors such as temperature sensors, pressure sensors, radiation sensors, and visible-blind ultraviolet detectors; and SAW (surface acoustic wave) devices, vibrators, resonators, oscillators, MEMS components, and piezoelectric actuators.

Embodying Mode 2

Figure 8:
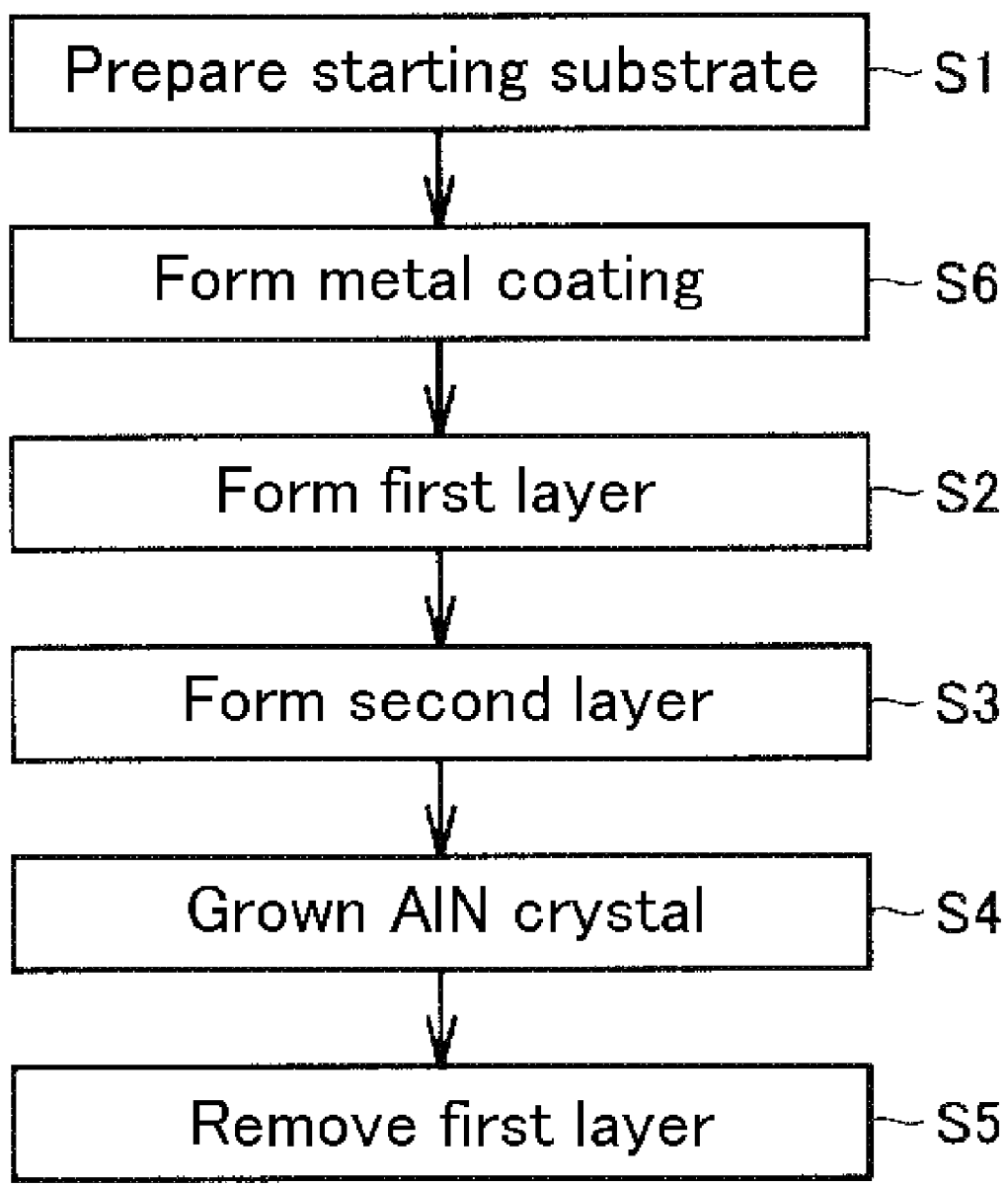
FIG. 8 is a flowchart presenting an aluminum-nitride-crystal growth method and manufacturing method in Embodying Mode 2 of the present invention.

FIG. 8 is a flowchart presenting an aluminum-nitride-crystal growth method and manufacturing method in the present embodying mode. As indicated in FIG. 8, a method of growing aluminum nitride crystal in the present embodying mode basically is the same as with Embodying Mode 1, but differs in that a laminar baseplate furnished with a metal coating is prepared (in being further provided with a Step S6 of forming a metal coating).

Figure 9:
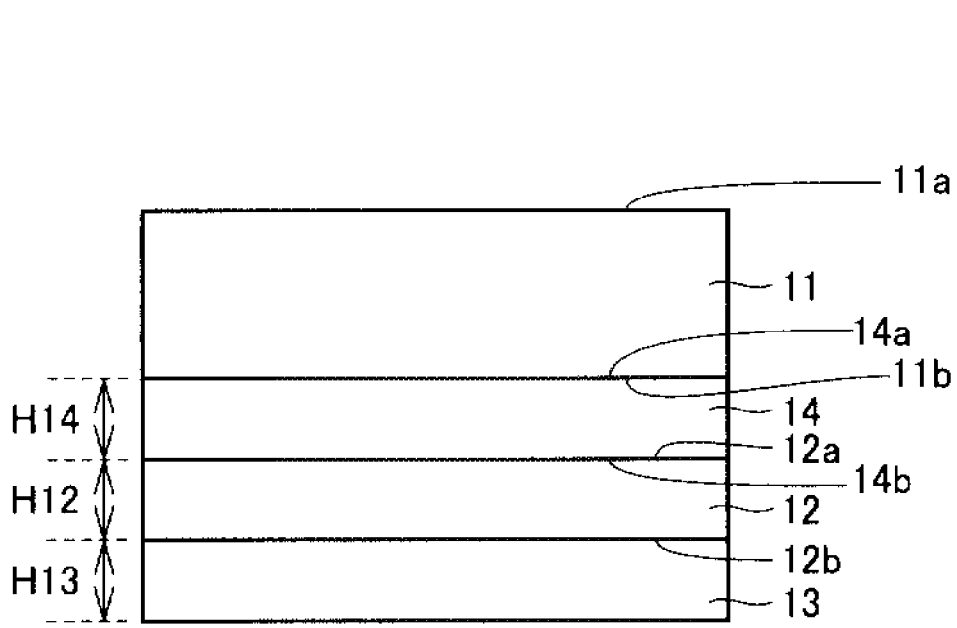
FIG. 9 is a schematic side view representing a laminar baseplate in Embodying Mode 2 of the present invention.

FIG. 9 is a schematic side view representing a laminar baseplate 10 in the present embodying mode. As indicated in FIGS. 8 and 9, to begin with, in the same manner as in Embodying Mode 1, a starting substrate 11 is prepared (Step S1).

Next, a metal coating 14 is formed on the back side 11b of the starting substrate 11 by evaporation deposition (Step S6). The thickness H14 of the metal coating 14 preferably is between 1 μm an 800 μm, more preferably between 1 μm and 200 μm. Being not less than 1 μm enables the heat-dissipating effectiveness of the metal coating 14 to be enhanced, thereby to prevent heat from accumulating in the starting substrate 11. Being not greater than 800 μm ensures that the metal coating 14 is kept from peeling from the starting substrate 11. Its thickness being under 200 μm allows effective prevention of the metal coating 14 peeling from the starting substrate 11.

Also, the metal coating 14 preferably consists of one substance selected from the group consisting of tungsten, tantalum and molybdenum.

Next, on the back side 14b of the metal coating (the surface on the reverse side from its major surface 14a in contact with the starting substrate 11), a first layer 12 is formed in the same manner as in Embodying Mode 1 (Step S2). In implementations where the first layer 12 is formed by sintering a blend, the blend is contacted onto the metal coating 14.

A second layer 13 is then formed on the back side 12b of the first layer 12, in the same way as in Embodying Mode 1. This allows a laminar baseplate 10 furnished with a starting substrate 11, metal coating 14, first layer 12, and second layer 13 to be prepared.

Figure 10:
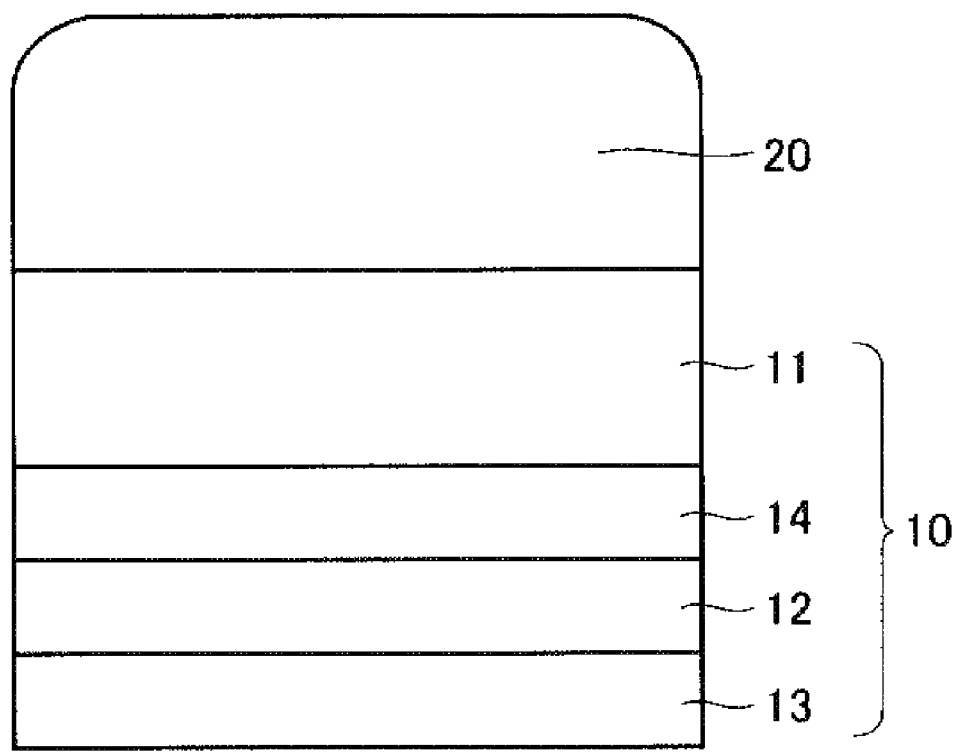
FIG. 10 is a schematic side view diagramming a situation in which aluminum nitride crystal has been grown, in Embodying Mode 2 of the present invention.

FIG. 10 is a schematic side view diagramming a situation in which aluminum nitride crystal 20 has been grown in the present embodying mode. With the back side 11b of the starting substrate 11 having been covered with the metal coating 14, the first layer 12 and the second layer 13, as indicated in FIGS. 8 and 10, aluminum nitride crystal 20 is grown by a vapor deposition process onto the major surface 11a of the starting substrate 11 in the same manner as in Embodying Mode 1 (Step S4).

Figure 11:
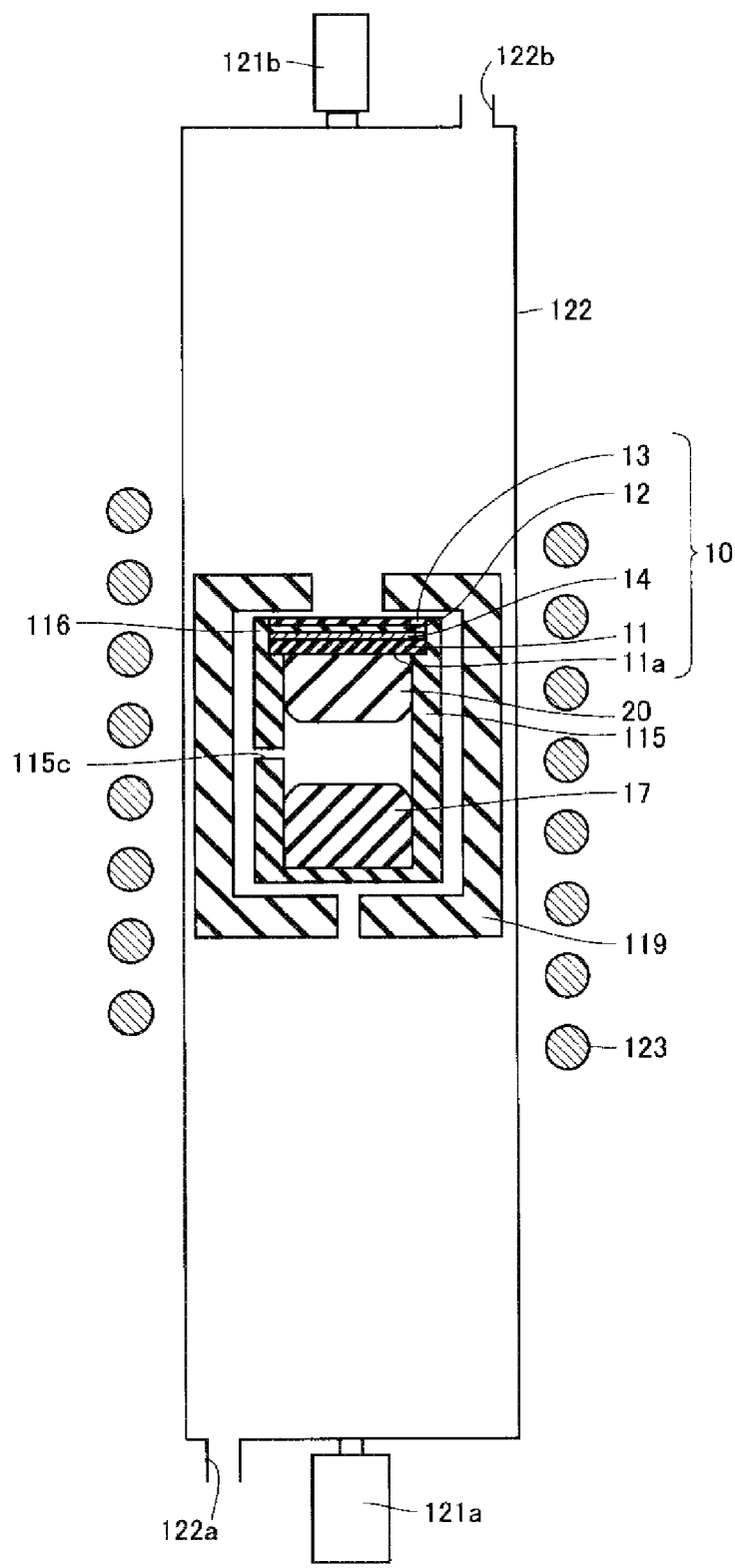
FIG. 11 is a schematic diagram representing a situation in which aluminum nitride crystal has been grown by sublimation deposition employing a laminar baseplate in Embodying Mode 2 of the present invention.

FIG. 11 is a schematic diagram representing a situation in which aluminum nitride crystal has been grown by sublimation deposition employing a laminar baseplate 10 in the present embodying mode. As indicated in FIG. 11, also in an implementation in which the laminar baseplate 10 is furnished with a metal coating 14, the laminar baseplate 10 is loaded onto the susceptor 116 in the same way as in Embodying Mode 1.

Figure 12:
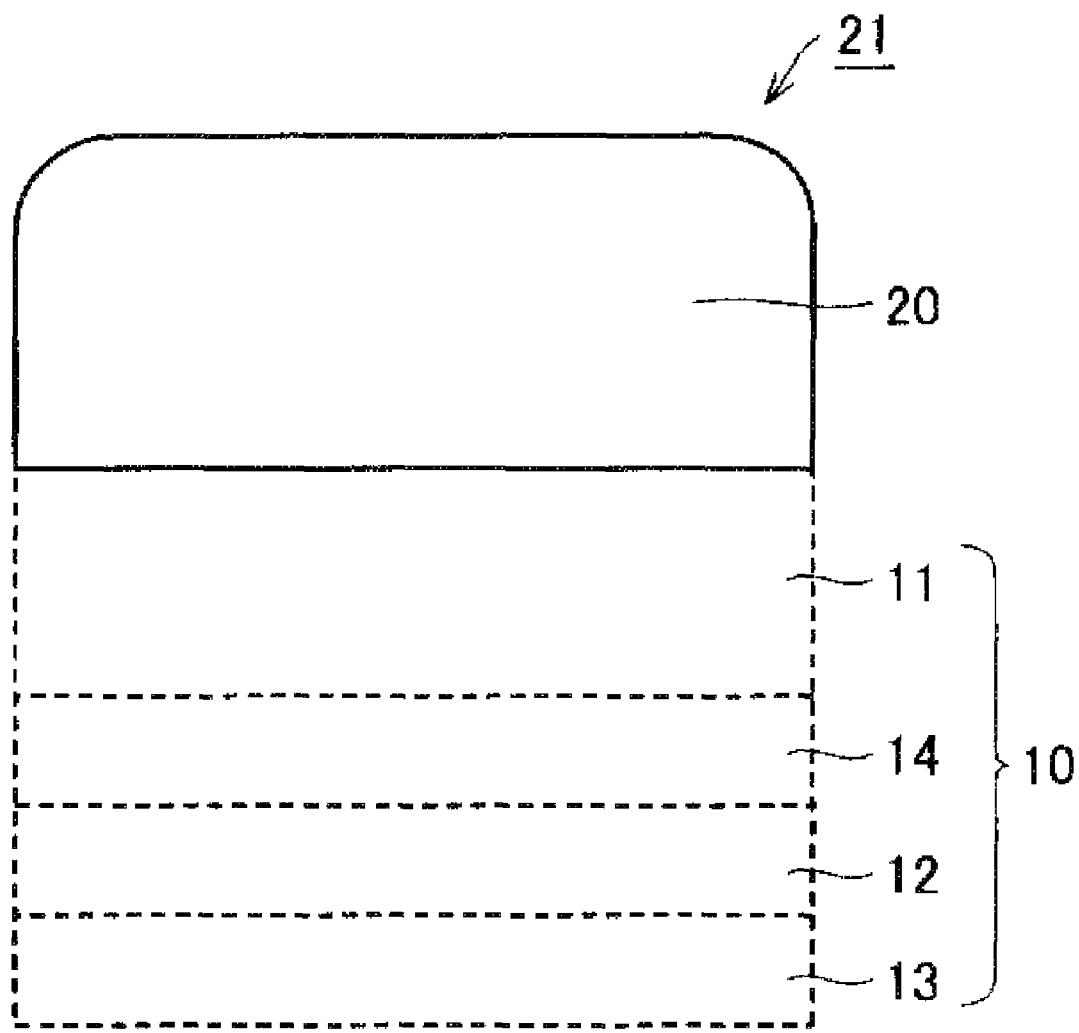
FIG. 12 is a schematic side view diagramming a situation in which at least the first layer has been cleared away, in Embodying Mode 2 of the present invention.

FIG. 12 is a schematic side view diagramming a situation in which at least the first layer 12 has been cleared away, in the present embodying mode. As indicated in FIGS. 8 and 12, next at least the first layer 12 is removed from the laminar baseplate 10 and aluminum nitride crystal 20 (Step S5).

Inasmuch as the metal coating 14 is etched by acidic solutions, the first layer 12 preferably is removed from the starting substrate 11 by etching the metal coating 14 away from the starting substrate 11.

It should be understood that apart from this, the aluminum-nitride-crystal growth method and manufacturing method are of the same constitution as the aluminum-nitride-crystal growth method and manufacturing method in Embodying Mode 1; thus identical components are labeled with identical reference marks and their description will not be repeated.

As described in the foregoing, the aluminum-nitride-crystal growth method and manufacturing method in the present embodying mode utilize a laminar baseplate 10 furnished with a starting substrate 11, a metal coating 14 formed on the back side 11b, a first layer 12 formed on the metal coating 14, and a second layer 13 formed on the first layer 12.

In accordance with the aluminum-nitride-crystal growth method and manufacturing method in the present embodying mode, given that the thermal conductivity of the metal coating 14 is very high, the radiant heat transfer of the metal coating 14 is very high and the thermal resistance at the interface between the metal coating 14 and the starting substrate 11 is low. Therefore, forming the metal coating 14 allows the effectiveness with which heat accumulating in the starting substrate 11 is dissipated to be extraordinarily improved.

Another benefit is that the metal coating 14 may be formed by evaporation deposition, and thus the problems with earlier-mentioned Patent Document 3 in employing a pressing member do not arise.

Furthermore, after the aluminum nitride crystal is grown, at least the first layer 12 may be readily cleared away from the aluminum nitride crystal 20 by etching it in an acid solution.

Embodiment 1

In the present embodiment, the effect from employing a second-layer-furnished laminar baseplate to grow aluminum nitride crystal was investigated. Specifically, laminar baseplates on which first and second layers of different thicknesses were formed along the back side of the starting substrate were utilized to grow aluminum nitride crystal on the major-surface side of the starting substrates, and whether holes in the aluminum nitride crystal had arisen was investigated.

In detail, to begin with, monocrystalline aluminum nitride substrates, fabricated by sublimation deposition and having a diameter of 10 mm and thickness of 500 μm, were prepared as starting substrates (Step S1). The monocrystalline aluminum nitride substrates had an off-axis angle of under 0.3°, and their major surface was finished to a specular plane and their back side was lapped.

Next, a powder consisting of monocrystalline aluminum nitride and having a 1 μm grain size was prepared. A solvent composed of acetone, formalin (formaldehyde), furfuryl alcohol, and a polyimide resin was also prepared. The powder and solvent were then mixed together so that the mix proportions by weight would be powder:solvent=100:35, and stirred until the mixture became a paste, whereby a blend was formed.

In addition, second layers, made of an aluminum nitride ceramic and having the thicknesses set forth in Table I below, were prepared. Here, the thermal conductivity of the aluminum nitride ceramic was 300 W/(m·K), while the thermal conductivity of the starting substrate was 400 W/(m·K).

Next, the just-described blend was spread uniformly onto the back side of the starting substrates, and the second layers were arranged onto the blend. A vacuum furnace was employed to heat the substrates in that state while defoaming them of air within the blend, and a load was applied to the starting substrates and the second layers to make the blend into the first layers and adhere fast together the starting substrates, first layers, and second layers. Here, the thermal conductivity of the first layer was 150 W/(m·K). The first-layer thicknesses were as in Table I below. Laminar baseplates furnished with a starting substrate, a first layer formed along the back side of the starting substrate, and a second layer formed on the first layer were thereby prepared (Steps S2 and S3).

It is to be noted that the furnace temperature was made 400° C., the ramp-up time, 30 minutes, the holding time, four hours, and the ramp-down time, one hour, for a total five-hour, thirty-minute heating period. Also, the applied load was 4.9 kPa in size, at a temperature of 400° C.

Next, the crystal growth reactor represented in FIG. 6 was employed to grow aluminum nitride crystal onto the major surface of the starting substrates by sublimation deposition (Step S4). In Step S4 of growing the aluminum nitride crystal, as indicated in FIG. 6, the laminar baseplate 10 is loaded into the upper part of the crucible 115 inside the reaction vessel 122, and polycrystalline aluminum nitride as the source material 17 is stowed into the bottom of the crucible 115. It should be noted that the susceptor 116 constituent material was carbon, with its thermal conductivity being 100 W/(cm·K).

Subsequently, while nitrogen gas was flowed inside the reaction vessel 122, the RF heating coil 123 was employed to elevate the temperature inside the crucible 115 and bring the temperature of the starting substrate 11 to 2000° C. and the temperature of the source material 17 to 2100° C., to sublime the source material 17 and recrystallize it onto the major surface of the starting substrate 11, and, with the growth time being 500 hours, grow aluminum nitride crystal to a thickness of 50 mm onto the starting substrate 11.

It will be noted that during the aluminum nitride crystal growth, nitrogen gas was continuously flowed inside the reaction vessel 122, with the nitrogen-gas exhaust volume being controlled so that the gas partial pressure inside the reaction vessel 122 would be some 10 kPa to 100 kPa.

The aluminum nitride crystal grown in this way was examined, under a light microscope, by an SEM, and visually, as to whether holes had arisen. In addition, whether the first and second layers had peeled from the starting substrates was investigated under a light microscope, by an SEM, and visually. The results are set forth in Table I. In Table I, "○" signifies that the first and second layers did not peel from the starting substrate; "X1" signifies that a portion of the first layer peeled from the starting substrate; and "X2" signifies that a portion of the second layer peeled from the first layer.

Characterization Results

There was no occurrence of holes in aluminum nitride grown utilizing any of the foregoing laminar baseplates furnished with a second layer having a thermal conductivity higher than that of the first layer. From this fact it was understood that the second layer could minimize heat buildup in the starting substrate.

In particular, as indicated in Table I, in the implementations in which aluminum nitride crystal was grown utilizing laminar baseplates whose first layer was between 0.05 mm and 10.0 mm in thickness and whose second layer was between 0.05 cm and 10.0 cm in thickness, because peeling of the first layer from the starting substrate, and peeling of the second layer from the first layer could be prevented, the starting substrates could be prevented from sublimating.

It should be noted that in the implementations in which at least either the first-layer thickness was 11.0 mm, or the second-layer thickness was 11.0 cm, at least either peeling of the first layer from the starting substrate, or peeling of the second layer from the first layer arose. Nevertheless, because buildup of heat in the starting substrate could be restrained, although part of the starting substrate sublimated and unevenness appeared on the starting-substrate back side, holes penetrating the starting substrate did not occur. Moreover, sublimation of the starting substrate in the initial stage during which the aluminum nitride crystal was grown could be prevented, making it possible to delay sublimation of the starting-substrate back side from progressing. Therefore, holes did not occur in the grown aluminum nitride.

From the foregoing it could be confirmed that, in accordance with the present embodiment, utilizing a second-layer furnished laminar baseplate to grow aluminum nitride crystal allowed accumulation of heat in the starting substrate to be held to a minimum, thus restraining sublimation of the starting substrate, to minimize the opening of holes in the aluminum nitride crystal grown onto the substrate.

Embodiment 2

In the present embodiment, the effect of implementations in which the first layer was made by sintering a blend in which a powder was mixed together with a solvent was investigated. Specifically, aluminum nitride crystal was grown on the major-surface side of starting substrates, with powders having different grain sizes being utilized to form the first layers, and whether holes had occurred in the aluminum nitride crystal was examined.

In detail, to begin with, starting substrates were prepared in the same manner as in Embodiment 1 (Step S1). Next, powders having grain sizes of 0.5 μm, 1.0 μm, 5.0 μm, 10 μm, 20

TABLE I

| | | Second layer thickness (cm) | | | | | | | | |
|---|---|---|---|---|---|---|---|---|---|---|
| | | 0.001 | 0.005 | 0.05 | 0.10 | 0.50 | 1.00 | 5.00 | 10.0 | 11.0 |
| First layer thickness (mm) | 0.05 | ○ | ○ | ○ | ○ | ○ | ○ | ○ | ○ | X1 |
| | 0.10 | ○ | ○ | ○ | ○ | ○ | ○ | ○ | ○ | X1 |
| | 0.50 | ○ | ○ | ○ | ○ | ○ | ○ | ○ | ○ | X1 |
| | 1.00 | ○ | ○ | ○ | ○ | ○ | ○ | ○ | ○ | X1 |
| | 5.00 | ○ | ○ | ○ | ○ | ○ | ○ | ○ | ○ | X1 |
| | 10.0 | ○ | ○ | ○ | ○ | ○ | ○ | ○ | ○ | X1, X2 |
| | 11.0 | X2 | X2 | X2 | X2 | X2 | X2 | X2 | X1, X2 | X1, X2 |

μm, 50 μm, 100 μm, 110 μm, 150 μm and 200 μm respectively were prepared. In addition, the same solvent as that of Embodiment 1 was prepared. The powders were then respectively mixed together with the solvent so that the mix proportions by weight would be powder:solvent=100:35, and stirred until the mixture became a paste, whereby respective blends were formed.

Further, the same second layers, made of an aluminum nitride ceramic, as in Embodiment 1, having a thickness of 1 cm were prepared.

Next, by sintering the blends in the same way as in Embodiment 1, laminar baseplates furnished with a starting substrate, a first layer having a thickness of 10 mm, formed along the back side of the starting substrate, and a second layer formed along the first layer were prepared (Steps S2 and S3).

Next, in the same way as in Embodiment 1, the crystal growth reactor represented in FIG. 6 was employed to grow aluminum nitride crystal onto the major surface of the starting substrates by sublimation deposition (Step S4).

It should be noted that depending on the prepared laminar baseplate, the temperature of the starting substrate 11 and the temperature of the source material 17 were varied appropriately. More exactly, for laminar baseplates in which powders having a 0.5-μm to 200-μm grain size were used, the temperature of the starting substrate 11 was made 2100° C. and the temperature of the source material 17 was made 2200° C.

The thus-grown aluminum nitride crystal was examined, in the same manner as in Embodiment 1, as to whether holes had arisen, whether the first layer had peeled from the starting substrate, and whether the second layer had peeled from the first layer. The results are set forth in Table II. It will be understood that in Table II, the significances of "○" and "X2" are the same as in Table I of Embodiment 1.

Further, the aluminum-nitride-crystal growth rates, by setting the temperature of the starting substrate 11 and the temperature of the source material 17 as noted above, were measured. The results are entered in Table II.

TABLE II

| Diameter (μm) | Growth rate | Peel status |
| --- | --- | --- |
| 0.5 | At least 50 μm/h | ○ |
| 1.0 | At least 50 μm/h | ○ |
| 5.0 | At least 50 μm/h | ○ |
| 10 | At least 50 μm/h | ○ |
| 20 | Less than 50 μm/h | ○ |
| 50 | Less than 50 μm/h | ○ |
| 100 | Less than 50 μm/h | ○ |
| 110 | Less than 50 μm/h | X2 |
| 150 | Less than 50 μm/h | X2 |
| 200 | Less than 50 μm/h | X2 |

Characterization Results

There was no occurrence of holes in aluminum nitride grown utilizing any of the foregoing second-layer furnished laminar baseplates.

In particular, as indicated in Table II, laminar baseplates furnished with a first layer made using powders having a 0.5-μm to 10-μm grain size could exteriorly disperse heat the starting substrate had received, thus allowing the temperature of the polycrystalline aluminum nitride source material to be set high. It was therefore possible to grow aluminum nitride crystal at high growth rates of 50 μm/h or more, without holes opening in the aluminum nitride crystal. This further allowed peeling of the first and second layers from the starting substrate to be controlled to a minimum.

Although the growth rate was slightly lower with the laminar baseplates furnished with first layers made using powders having a 20-μm to 100-μm grain size, because they required setting the polycrystalline aluminum nitride source material temperature lower than did the laminar baseplates furnished with first layers made using powders having a 0.5-μm to 10-μm grain size, peeling of the first and second layers from the starting substrate could be prevented.

With the laminar baseplates furnished with first layers made using powders having a 110-μm to 200-μm grain size, the set temperature for the polycrystalline aluminum nitride source material was the same as that in the implementations employing laminar baseplates furnished with first layers made using powders having a 20-μm to 100-μm grain size. And although with the laminar baseplates furnished with first layers made using powders having a 110-μm to 200-μm grain size, unevenness formed on the starting-substrate back side because the first layer peeled from the second layer, holes penetrating the starting substrate did not occur.

From the foregoing it could be confirmed that, in accordance with the present embodiment, in implementations furnished with a first layer made by sintering a powder and dissolvent, by the powder having a grain size of between 0.5 μm and 10 μm, accumulation of heat in the starting substrate could be further controlled to a minimum.

Embodiment 3

In the present embodiment, likewise as in Embodiment 1, the effect from employing a second-layer-furnished laminar baseplate to grow aluminum nitride crystal was investigated.

In detail, to begin with, monocrystalline silicon carbide substrates having a diameter of 50 mm and thickness of 400 μm were prepared as starting substrates (Step S1). The monocrystalline silicon carbide substrates' off-axis angle with respect to the (0002) crystal orientation was 3°, and their major surface was finished to a specular plane and their back side was lapped.

Next, carbon of 99.99% purity and having a 10 μm grain size was prepared as a powder. A solvent composed of acetone, formalin (formaldehyde), furfuryl alcohol, and a polyimide resin was also prepared. The powder and solvent were then mixed together so that the mix proportions by weight would be powder:solvent=100:35, and stirred until the mixture became a paste, whereby a blend was formed.

In addition, carbon substrates having the thicknesses entered in Table III below were prepared as second layers. Here, the thermal conductivity of the carbon substrates was 200 W/(m·K), and the thermal conductivity of the starting substrates was 400 W/(m·K).

Next, by sintering the blends in the same way as in Embodiment 1, laminar baseplates furnished with a starting substrate, a first layer formed along the back side of the starting substrate, and a second layer formed along the first layer were prepared (Steps S2 and S3). Here, the thermal conductivity of the first layer was the same 150 W/(m·K) as in Embodiment 1, and the first-layer thicknesses were as in Table III below. Furthermore, in the present embodiment the furnace temperature was made 350° C., the ramp-up time, 30 minutes, the holding time, three hours, and the ramp-down time, one hour, for a total four-hour, thirty-minute heating period.

Next, in the same way as in Embodiment 1, the crystal growth reactor represented in FIG. 6 was employed to grow aluminum nitride crystal onto the major surface of the starting substrates by sublimation deposition (Step S4). In the present embodiment, the temperature of the starting substrate 11 was made 1700° C. and the temperature of the source material 17 was made 1900° C., to sublime the source material 17 and recrystallize it onto the major surface of the starting substrate 11, and, with the growth time being 500 hours, grow aluminum nitride crystal to a thickness of 25 mm onto the starting substrate 11. Here, the conditions during growth of the aluminum nitride crystal were made the same as those of Embodiment 1.

The thus-grown aluminum nitride crystal was examined, in the same manner as in Embodiment 1, as to whether holes had arisen, whether the first layer had peeled from the starting substrate, and whether the second layer had peeled from the first layer. The results are set forth in Table III below. In Table III, the significances of "○," "X1," and "X2" are the same as in Table I of Embodiment 1.

TABLE III

| | | Second layer thickness (cm) | | | | | | |
|---|---|---|---|---|---|---|---|---|
| | | 0.05 | 0.10 | 0.50 | 1.00 | 5.00 | 10.0 | 11.0 |
| First layer thickness (mm) | 0.05 | ○ | ○ | ○ | ○ | ○ | ○ | X1 |
| | 0.10 | ○ | ○ | ○ | ○ | ○ | ○ | X1 |
| | 0.50 | ○ | ○ | ○ | ○ | ○ | ○ | X1 |
| | 1.00 | ○ | ○ | ○ | ○ | ○ | ○ | X1 |
| | 5.00 | ○ | ○ | ○ | ○ | ○ | ○ | X1 |
| | 10.0 | ○ | ○ | ○ | ○ | ○ | ○ | X1, X2 |
| | 11.0 | X2 | X2 | X2 | X2 | X2 | X1, X2 | X1, X2 |

Characterization Results

There was no occurrence of holes in aluminum nitride grown utilizing any of the foregoing laminar baseplates, which were furnished with a second layer having a thermal conductivity higher than that of the first layer. From this fact it was understood that by means of the second layer the accumulating of heat in the starting substrate could be minimized.

In particular, as indicated in Table III, in the implementations in which aluminum nitride crystal was grown utilizing laminar baseplates whose first layer was between 0.05 mm and 10.0 mm in thickness and whose second layer was between 0.05 cm and 10.0 cm in thickness, because peeling of the first layer from the starting substrate, and peeling of the second layer from the first layer could be prevented, the starting substrates could be prevented from sublimating.

It should be noted that in the implementations in which at least either the first-layer thickness was 11.0 mm, or the second-layer thickness was 11.0 cm, at least either peeling of the first layer from the starting substrate, or peeling of the second layer from the first layer arose. Nevertheless, because buildup of heat in the starting substrate could be restrained, although part of the starting substrate sublimated and unevenness appeared on the starting-substrate back side, holes penetrating the starting substrate did not occur, and therefore holes did not occur in the grown aluminum nitride.

From the foregoing it could be confirmed that, in accordance with the present embodiment, utilizing a second-layer furnished laminar baseplate to grow aluminum nitride crystal allowed accumulation of heat in the starting substrate to be held to a minimum, thus restraining sublimation of the starting substrate to minimize the opening of holes in the aluminum nitride crystal grown onto the substrate. It could also be confirmed that implementations in which the starting substrate was a silicon carbide substrate and the second layer contained carbon atoms had the same effects as with Embodiment 1.

Embodiment 4

In the present embodiment, likewise as with Embodiment 2, the effect of implementations in which the first layer was made by sintering a blend in which a powder was mixed together with a solvent was investigated.

In detail, to begin with, starting substrates were prepared in the same manner as in Embodiment 3 (Step S1). Next, powders having grain sizes of 0.5 μm, 1.0 μm, 5.0 μm, 10 μm, 20 μm, 50 μm, 100 μm, 110 μm, 150 μm and 200 μm respectively were prepared. In addition, the same solvent as that of Embodiment 3 was prepared. The powders were then respectively mixed together with the solvent so that the mix proportions by weight would be powder:solvent=100:35, and stirred until the mixture became a paste, whereby respective blends were formed. Furthermore, the same second layers as those of Embodiment 3 were prepared.

Next, by sintering the blends in the same way as in Embodiment 3, laminar baseplates furnished with a starting substrate, a first layer having a thickness of 10 mm, formed along the back side of the starting substrate, and a second layer formed along the first layer were prepared (Steps S2 and S3).

Next, in the same way as in Embodiment 3, the crystal growth reactor represented in FIG. 6 was employed to grow aluminum nitride crystal onto the major surface of the starting substrates by sublimation deposition (Step S4). Here, depending on the laminar baseplate, the temperature of the starting substrate 11 and the temperature of the source material 17 were varied appropriately. More exactly, for laminar baseplates in which powders having a 0.5-μm to 200-μm grain size were used, the temperature of the starting substrate 11 was made 1800° C. and the temperature of the source material 17 was made 2000° C.

The thus-grown aluminum nitride crystal was examined, in the same manner as in Embodiment 1, as to whether holes had arisen, whether the first layer had peeled from the starting substrate, and whether the second layer had peeled from the first layer. The results are set forth in Table IV. It will be understood that in Table IV, the significances of "○" and "X2" are the same as in Table I of Embodiment 1.

TABLE IV

| Diameter (μm) | Growth rate | Peel status |
|---|---|---|
| 0.5 | At least 50 μm/h | ○ |
| 1.0 | At least 50 μm/h | ○ |
| 5.0 | At least 50 μm/h | ○ |
| 10 | At least 50 μm/h | ○ |
| 20 | Less than 50 μm/h | ○ |
| 50 | Less than 50 μm/h | ○ |
| 100 | Less than 50 μm/h | ○ |
| 110 | Less than 50 μm/h | X2 |
| 150 | Less than 50 μm/h | X2 |
| 200 | Less than 50 μm/h | X2 |

Characterization Results

There was no occurrence of holes in aluminum nitride grown utilizing any of the foregoing second-layer furnished laminar baseplates.

In particular, as indicated in Table IV, laminar baseplates furnished with a first layer made using powders having a 0.5-μm to 10-μm grain size could disperse to outside the starting substrate heat the starting substrate had received, thus allowing the temperature of the polycrystalline aluminum nitride source material to be set high. It was therefore possible to grow aluminum nitride crystal at high growth rates of 50 μm/h or more, without holes opening in the aluminum nitride crystal. This further allowed peeling of the first and second layers from the starting substrate to be controlled to a minimum.

Although the growth rate was slightly lower with the laminar baseplates furnished with first layers made using powders having a 20-μm to 100-μm grain size, because they required setting the polycrystalline aluminum nitride source-material temperature lower than did the laminar baseplates furnished with first layers made using powders having a 0.5-μm to 10-μm grain size, peeling of the first and second layers from the starting substrate could be prevented.

With the laminar baseplates furnished with first layers made using powders having a 110-μm to 200-μm grain size, the set temperature for the polycrystalline aluminum nitride source material was the same as that in the implementations employing laminar baseplates furnished with first layers made using powders having a 20-μm to 100-μm grain size. And although with the laminar baseplates furnished with first layers made using powders having a 110-μm to 200-μm grain size, unevenness formed on the starting-substrate back side because the first layer peeled from the second layer, holes penetrating the starting substrate did not occur.

From the foregoing it could be confirmed that, in accordance with the present embodiment, in implementations furnished with a first layer made by sintering a powder and dissolvent, by the powder having a grain size of between 0.5 μm and 10 μm, accumulation of heat in the starting substrate could be further controlled to a minimum.

Embodiment 5

In the present embodiment, the peel-restraining effectiveness according to the difference in thermal expansion coefficient of the first layer and the second layer with respect to the starting substrate was investigated. Specifically, aluminum nitride crystal was grown on the major-surface side of starting substrates on which first and second layers having different thermal expansion coefficients were formed, and whether holes had occurred in the aluminum nitride crystal was examined.

In detail, to begin with, starting substrates were prepared in the same manner as in Embodiment 3. The thermal expansion coefficient of the starting substrate at 2000° C. was $7.0 \times 10^{-6°}$ $C.^{-1}$. Next, blend layers whereby the absolute value of the difference between the thermal expansion coefficient of the first layers and the thermal expansion coefficient of the starting substrates, in a temperature range of from room temperature to 2300° C., would be in a range of less than $1.0 \times 10^{-6°}$ $C.^{-1}$ down to $1.1 \times 10^{-5°}$ $C.^{-1}$ were formed on the back side of the starting substrates. In addition, carbon plates for second layers whereby the absolute value of the difference between the thermal expansion coefficient of the second layers and the thermal expansion coefficient of the starting substrates, in a temperature range of from room temperature to 2300° C., would be in a range of less than $1.0 \times 10^{-6°}$ $C.^{-1}$ down to $1.1 \times 10^{-5°}$ $C.^{-1}$ were prepared.

Next, by sintering the blends in the same way as in Embodiment 1, laminar baseplates furnished with a starting substrate, a first layer formed along the back side of the starting substrate, and a second layer formed along the first layer were prepared (Steps S2 and S3).

Next, in the same way as in Embodiment 1, the crystal growth reactor represented in FIG. 6 was employed to grow aluminum nitride crystal onto the major surface of the starting substrates by sublimation deposition (Step S4).

The grown aluminum nitride crystal was examined as to whether holes had arisen, whether the first layer had peeled from the starting substrate, and whether the second layer had peeled from the first layer. The characterization method was basically the same as in Embodiment 1, but differed in that an ultrasonic flaw detector was additionally employed. The results are set forth in Table V. It will be understood that in Table V, the significances of "○" and "X1" are the same as in Table I of Embodiment 1.

TABLE V

|  | Absolute value of difference between starting-substrate and first-layer thermal expansion coefficients ($\times 10^{-6°}$ $C.^{-1}$) | | | | | | | | | | | |
| --- | --- | --- | --- | --- | --- | --- | --- | --- | --- | --- | --- | --- |
|  | Less than 1 | 1 | 2 | 3 | 4 | 5 | 6 | 7 | 8 | 9 | 10 | 11 |
| Absolute value of difference between starting-substrate and second-layer thermal expansion coefficients ($\times 10^{-6°}$ $C.^{-1}$) Less than 1 | ○ | ○ | ○ | ○ | ○ | ○ | ○ | ○ | ○ | ○ | ○ | X1 |
| 1 | ○ | ○ | ○ | ○ | ○ | ○ | ○ | ○ | ○ | ○ | ○ | X1 |
| 2 | ○ | ○ | ○ | ○ | ○ | ○ | ○ | ○ | ○ | ○ | ○ | X1 |
| 3 | ○ | ○ | ○ | ○ | ○ | ○ | ○ | ○ | ○ | ○ | ○ | X1 |
| 4 | ○ | ○ | ○ | ○ | ○ | ○ | ○ | ○ | ○ | ○ | ○ | X1 |
| 5 | ○ | ○ | ○ | ○ | ○ | ○ | ○ | ○ | ○ | ○ | ○ | X1 |
| 6 | ○ | ○ | ○ | ○ | ○ | ○ | ○ | ○ | ○ | ○ | ○ | X1 |
| 7 | ○ | ○ | ○ | ○ | ○ | ○ | ○ | ○ | ○ | ○ | ○ | X1 |
| 8 | ○ | ○ | ○ | ○ | ○ | ○ | ○ | ○ | ○ | ○ | ○ | X1 |
| 9 | ○ | ○ | ○ | ○ | ○ | ○ | ○ | ○ | ○ | ○ | ○ | X1 |
| 10 | ○ | ○ | ○ | ○ | ○ | ○ | ○ | ○ | ○ | ○ | ○ | X1 |
| 11 | X1 | X1 | X1 | X1 | X1 | X1 | X1 | X1 | X1 | X1 | X1 | X1 |

Characterization Results

As indicated in Table V, in implementations in which the absolute value of the difference between the thermal expansion coefficient of the starting substrate and the thermal expansion coefficient of the first layer was not greater than $1.0 \times 10^{-5°}$ $C.^{-1}$, and the absolute value of the difference between the thermal expansion coefficient of the starting substrate and the thermal expansion coefficient of the second layer was not greater than $1.0 \times 10^{-5°}$ $C.^{-1}$, peeling between the starting substrate and the first layer, and between the first layer and the second layer, did not occur, such that there was no incidence of holes in the grown aluminum nitride crystal. Therefore, by bringing the thermal expansion coefficient of the first and second layers close to the thermal expansion coefficient of the starting substrate, in the subsequent cooling, peeling that would arise from the difference in thermal expansion coefficient could be minimized.

It should be noted that in the implementations in which at least either the absolute value of the difference between the thermal expansion coefficient of the starting substrate and the thermal expansion coefficient of the first layer was $1.1 \times 10^{-5}$/° C., or the absolute value of the difference between the thermal expansion coefficient of the starting substrate and the thermal expansion coefficient of the second layer was $1.1 \times 10^{-5}$/° C., peeling of the first layer from the starting substrate arose.

Nevertheless, because buildup of heat in the starting substrate could be restrained, although part of the starting substrate sublimated and unevenness appeared on the starting-substrate back side, holes penetrating the starting substrate did not occur. Moreover, sublimation of the starting substrate in the initial stage during which the aluminum nitride crystal was grown could be prevented, making it possible to delay sublimation of the starting-substrate back side from progressing. Therefore, holes did not occur in the grown aluminum nitride.

From the foregoing it could be confirmed that, in accordance with the present embodiment, by making the absolute value of the difference between the thermal expansion coefficient of the starting substrate and the thermal expansion coefficient of the first layer not greater than $1.0 \times 10^{-5\circ} \text{C}.^{-1}$, and the absolute value of the difference between the thermal expansion coefficient of the starting substrate and the thermal expansion coefficient of the second layer not greater than $1.0 \times 10^{-5\circ} \text{C}.^{-1}$, in a temperature range of from room temperature to 2300° C., peeling of the first and second layers from the starting substrate to be controlled to a minimum.

Embodiment 6

In the present embodiment, the effectiveness of utilizing, to grow aluminum nitride crystal, a laminar baseplate further furnished with a metal coating was investigated. Specifically, titanium films of different thicknesses were formed onto the back side of starting substrates, aluminum nitride crystal was grown on the major-surface side of the starting substrates, and whether holes in the aluminum nitride crystal had arisen was investigated.

In detail, to begin with, starting substrates were prepared in the same manner as in Embodiment 1 (Step S1). Next, metal coatings having thicknesses of 1 μm, 10 μm, 50 μm, 100 μm, 200 μm, 500 μm, 800 μm and 1000 μm were formed by evaporation deposition.

Next, a powder having a 50-μm grain size was prepared. Furthermore, the same solvent as that of Embodiment 1 was prepared. The powder and the solvent were then each mixed together so that the mix proportions by weight would be powder:solvent=100:35, and stirred until the mixture became a paste, whereby respective blends were formed.

Further, second layers made of an aluminum nitride ceramic and having a thickness of 1 cm were prepared.

Next, by contacting the blend onto the metal coatings, arranging the second layers onto the blends, and sintering the blends in the same way as in Embodiment 1, laminar baseplates furnished with a starting substrate, a metal coating formed along the back side of the starting substrate, a first layer having a thickness of 10 mm, formed on the metal coating, and a second layer formed on the first layer were prepared (Steps S2 and S3). It should be noted that thermal conductivities of the first layer, the second layer, the starting substrate and the susceptor were the same as in Embodiment 1.

Next, a crystal growth reactor as represented in FIG. 11 was employed in the same way as in Embodiment 1, to grow aluminum nitride crystal onto the major surface of the starting substrates by sublimation deposition (Step S4).

The thus-grown aluminum nitride crystal was examined, in the same manner as in Embodiment 1, as to whether holes had arisen, whether the first layer had peeled from the starting substrate, and whether the second layer had peeled from the first layer. The results are set forth in Table VI.

TABLE VI

| Titanium layer thickness (μm) | Presence of peeling |
| --- | --- |
| 1 | None |
| 10 | None |
| 50 | None |
| 100 | None |
| 200 | None |
| 500 | Partial peeling |
| 800 | Partial peeling |
| 1000 | Global peeling |

Characterization Results

In aluminum nitride grown utilizing all of the foregoing laminar baseplates furnished with metal coatings and second layers, there was no occurrence of holes.

In particular, as indicated in Table VI, with laminar baseplates furnished with a metal coating having a thickness of—whose metal-coating thickness was—1 μm to 200 μm, heat that the starting substrate had received could be dispersed exteriorly by the metal coating and second layer, thus ensuring that peeling of the first and second layers from the starting substrate was controlled to a minimum.

With the laminar baseplates furnished with the metal coatings having thicknesses of 500 μm to 800 μm, the metal coatings partially peeled from the starting substrates. Nevertheless, since heat building up in the starting substrate could be minimized by the metal coating and second layer, although due to part of the starting substrate sublimating, unevenness appeared on its back side, holes penetrating the starting substrate did not occur.

Also, with the laminar baseplate furnished with the metal coating having a thickness of 1000 μm, although the metal coating peeled from the starting substrate, because the greater part of the grown aluminum nitride crystal was at the completed point, although unevenness appeared on the starting substrate, there was no incidence of holes penetrating the starting substrate.

From the foregoing it could be confirmed that, in accordance with the present embodiment, by utilizing a metal-coating furnished laminar baseplate, sublimation of the starting substrate could be restrained. It was also confirmed that a metal coating having a thickness of between 1 μm and 200 μm was effective to protect the starting substrate.

Embodiment 7

With the present embodiment, it was basically the same as Embodiment 6, differing from Embodiment 6 only in that metal coatings made of molybdenum were formed. The results are presented in Table VII below.

TABLE VII

| Molybdenum layer thickness (μm) | Presence of peeling |
| --- | --- |
| 1 | None |
| 10 | None |
| 50 | None |
| 100 | None |
| 200 | None |
| 500 | Partial peeling |
| 800 | Partial peeling |
| 1000 | Global peeling |

In aluminum nitride grown utilizing all of the foregoing laminar baseplates furnished with metal coatings and second layers, there was no incidence of holes.

Further, it could be confirmed that in implementations employing laminar baseplates furnished with a metal coating made of molybdenum, likewise as with Embodiment 6, in which the metal coatings were made of titanium, with those implementations having a thickness of between 1 μm and 200 μm, the starting substrate could be protected more effectively.

Embodiment 8

With the present embodiment, it was basically the same as Embodiment 6, differing from Embodiment 6 only in that metal coatings made of tungsten were formed. The results are presented in Table VIII below.

TABLE VIII

| Tungsten layer thickness (μm) | Presence of peeling |
| --- | --- |
| 1 | None |
| 10 | None |
| 50 | None |
| 100 | None |
| 200 | None |
| 500 | Partial peeling |
| 800 | Partial peeling |
| 1000 | Global peeling |

In aluminum nitride grown utilizing all of the foregoing laminar baseplates furnished with metal coatings and second layers, there was no incidence of holes.

Further, it could be confirmed that in implementations employing laminar baseplates furnished with a metal coating made of tungsten, likewise as with Embodiment 6, in which the metal coatings were made of titanium, and as with Embodiment 7, in which the metal coatings were made of molybdenum, with those implementations having a thickness of between 1 μm and 200 μm, the starting substrate could be protected more effectively.

The presently disclosed embodying modes and embodiments should in all respects be considered to be illustrative and not limiting. The scope of the present invention is set forth not by the above-described embodying modes, but by the scope of the patent claims, and is intended to include meanings equivalent to the scope of the patent claims and all modifications within the scope.

The invention claimed is:

1. An aluminum nitride crystal growth method comprising:
a step of preparing a laminar baseplate furnished with a starting substrate having a major surface and a back side on the reverse side from the major surface, a first layer formed on the back side, and a second layer formed on the first layer; and
a step of growing aluminum nitride crystal onto the major surface of the starting substrate by vapor deposition; wherein
the first layer is made of a substance that at the temperatures at which the aluminum nitride crystal is grown is less liable to sublimate than the starting substrate;
the second layer is made of a substance whose thermal conductivity is higher than that of the first layer;
the preparation step includes:
a substep of arranging on the back side of the starting substrate a blend in which a powder and a solvent have been mixed together, and disposing the second layer onto the blend; and
a substep of sintering the blend in order to make it into the first layer; and
the solvent is made by mixing together acetone, formalin (formaldehyde), furfuryl alcohol, and a polyimide resin.

2. An aluminum nitride crystal growth method as set forth in claim 1, wherein:
the growth of the aluminum nitride crystal is conducted with the laminar baseplate having been loaded onto a susceptor; and
the second layer is made of a substance whose thermal conductivity is higher than that of the susceptor.

3. An aluminum nitride crystal growth method as set forth in claim 1, wherein:
the starting substrate is an aluminum nitride substrate; and
the powder is monocrystalline aluminum nitride.

4. An aluminum nitride crystal growth method as set forth in claim 1, wherein:
the starting substrate is an aluminum nitride substrate; and
the powder is a powder of one or more substances selected from the group consisting of polycrystalline aluminum nitride, aluminum nitride ceramics, and aluminum nitride compounds.

5. An aluminum nitride crystal growth method as set forth in claim 1, wherein the powder is a powder of one or more substances selected from the group consisting of zirconium boride, titanium boride, tantalum boride, niobium boride, molybdenum boride and chromium boride.

6. An aluminum nitride crystal growth method as set forth in claim 1, wherein:
the starting substrate is a silicon carbide substrate; and
the powder contains carbon atoms.

7. An aluminum nitride crystal growth method as set forth in claim 1, wherein the second layer contains carbon atoms.

8. An aluminum nitride crystal growth method as set forth in claim 1, wherein the second layer contains aluminum nitride.

9. An aluminum nitride crystal growth method as set forth in claim 1, wherein the thickness of the second layer is from 10 μm to 10 cm.

10. An aluminum nitride crystal growth method as set forth in claim 1, wherein, in a temperature range of from room temperature to 2300° C.:
the absolute value of the difference between the thermal expansion coefficient of the starting substrate and the thermal expansion coefficient of the first layer is not greater than $1.0 \times 10^{-5}$°C.$^{-1}$; and
the absolute value of the difference between the thermal expansion coefficient of the starting substrate and the thermal expansion coefficient of the second layer is not greater than $1.0 \times 10^{-5}$°C.$^{-1}$.

11. An aluminum nitride crystal growth method as set forth in claim 1, wherein said preparation step includes a substep of forming a metal coating onto the back side of the starting substrate by evaporation deposition.

12. An aluminum nitride crystal growth method as set forth in claim 11, wherein the thickness of the metal coating is between 1 μm and 800 μm.

13. An aluminum nitride crystal growth method as set forth in claim 11, wherein the metal coating is made of one or more substances selected from the group consisting of tungsten, tantalum and molybdenum.

14. An aluminum nitride crystal manufacturing method comprising:
a step of growing aluminum nitride crystal by an aluminum nitride crystal growth method as set forth in claim 1; and
a step of removing at least the first layer.

15. Aluminum nitride crystal manufactured by an aluminum nitride crystal manufacturing method as set forth in claim 14.

* * * * *